United States Patent
Narita et al.

(10) Patent No.: US 7,350,289 B2
(45) Date of Patent: Apr. 1, 2008

(54) COMPONENT FEEDING HEAD APPARATUS, FOR HOLDING A COMPONENT ARRAYED

(75) Inventors: Shoriki Narita, Hirakata (JP); Shuichi Hirata, Osaka (JP); Kanji Hata, Katano (JP); Hirokuni Miyazaki, Neyagawa (JP); Youhei Matsumoto, Nagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 302 days.

(21) Appl. No.: 10/536,361

(22) PCT Filed: Dec. 1, 2003

(86) PCT No.: PCT/JP03/15317

§ 371 (c)(1),
(2), (4) Date: May 26, 2005

(87) PCT Pub. No.: WO2004/051731

PCT Pub. Date: Jun. 17, 2004

(65) Prior Publication Data

US 2006/0104754 A1 May 18, 2006

(30) Foreign Application Priority Data

Dec. 2, 2002 (JP) ............................... 2002-349857

(51) Int. Cl.
*B23P 19/00* (2006.01)

(52) U.S. Cl. ............................ 29/743; 29/739; 29/740; 29/742; 29/744

(58) Field of Classification Search ................ 29/740, 29/739, 742, 743, 744
See application file for complete search history.

(56) References Cited

U.S. PATENT DOCUMENTS

| | | | | |
|---|---|---|---|---|
| 5,033,185 A | * | 7/1991 | Hidese | 29/740 |
| 5,628,107 A | * | 5/1997 | Nushiyama et al. | 29/740 |
| 5,636,435 A | * | 6/1997 | Okumoto et al. | 29/740 |
| 5,833,591 A | * | 11/1998 | Abe et al. | 483/12 |

FOREIGN PATENT DOCUMENTS

| | | |
|---|---|---|
| EP | 895450 | 2/1999 |
| JP | 11-102936 | 4/1999 |
| JP | 2000-94232 | 4/2000 |
| JP | 2004-47927 | 2/2004 |
| JP | 2004-047927 | * 12/2004 |

* cited by examiner

*Primary Examiner*—A. Dexter Tugbang
*Assistant Examiner*—Tai Van Nguyen
(74) *Attorney, Agent, or Firm*—Wenderoth, Lind & Ponack, L.L.P.

(57) ABSTRACT

In component feeding head apparatus, a head unit having a holding unit for releasably holding a component and a rotating unit for rotating the holding unit around its center of axis is set as an object of an up-and-down operation and an inverting operation, and a head lifting device for moving the head unit up and down and a head inverting device for inverting the head unit are provided as constructions independent from the head unit that is the object.

12 Claims, 15 Drawing Sheets

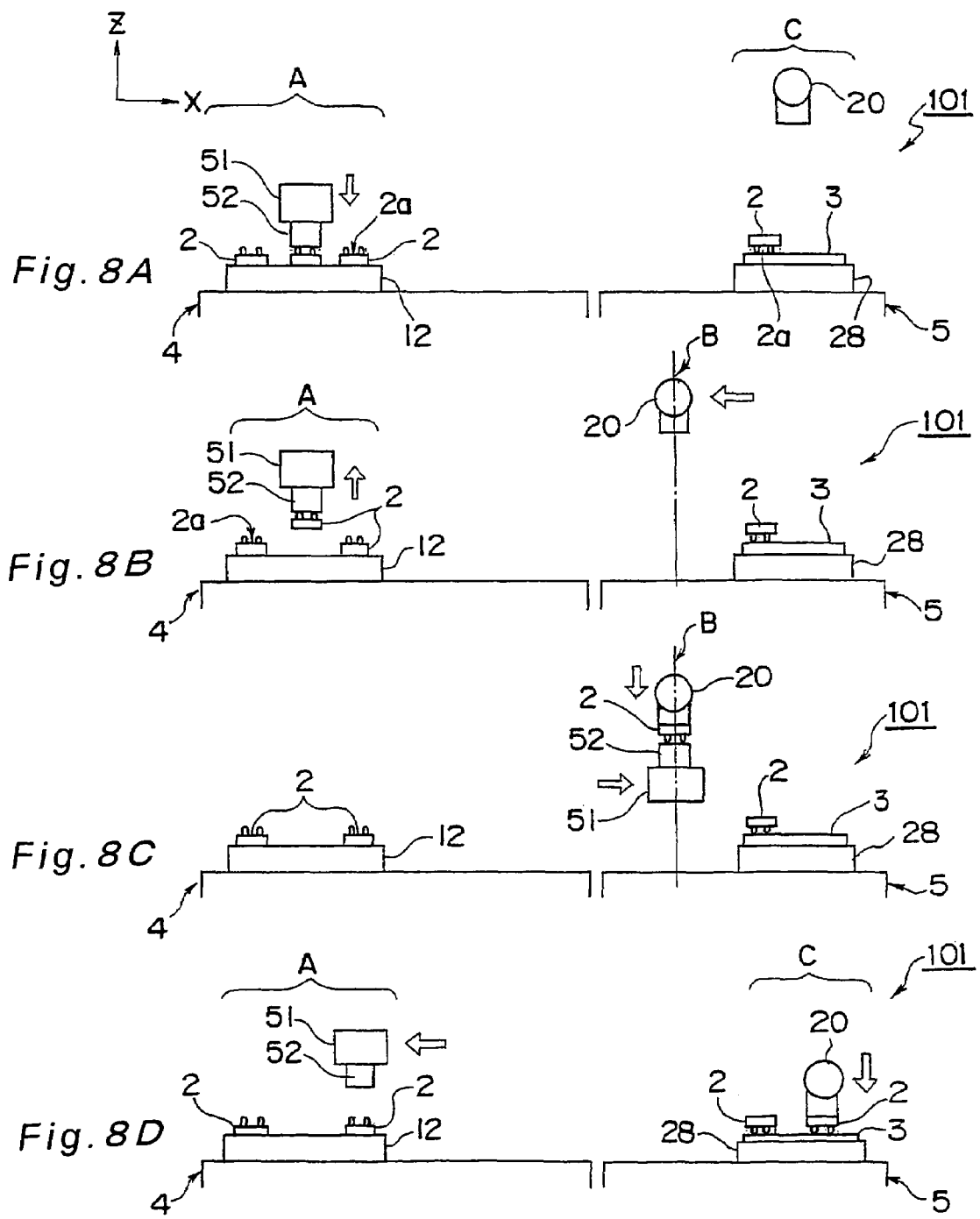

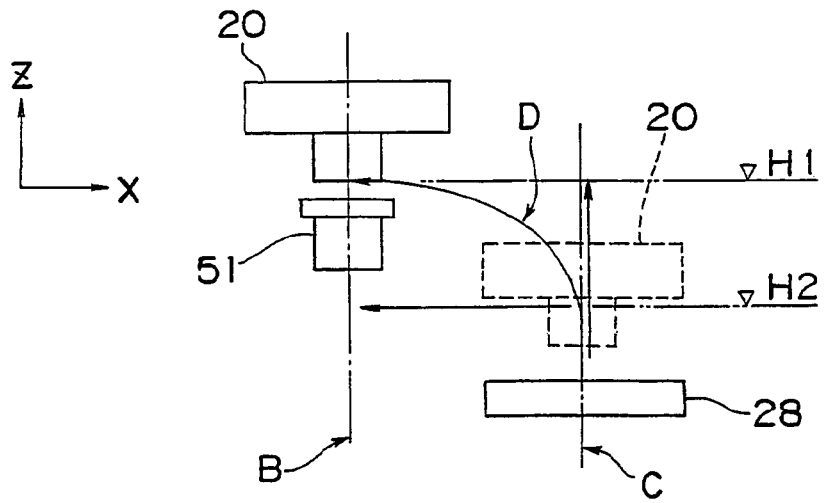
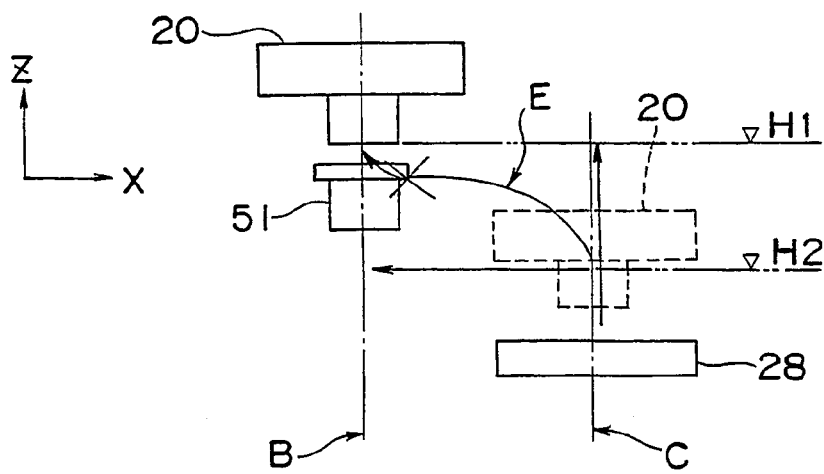
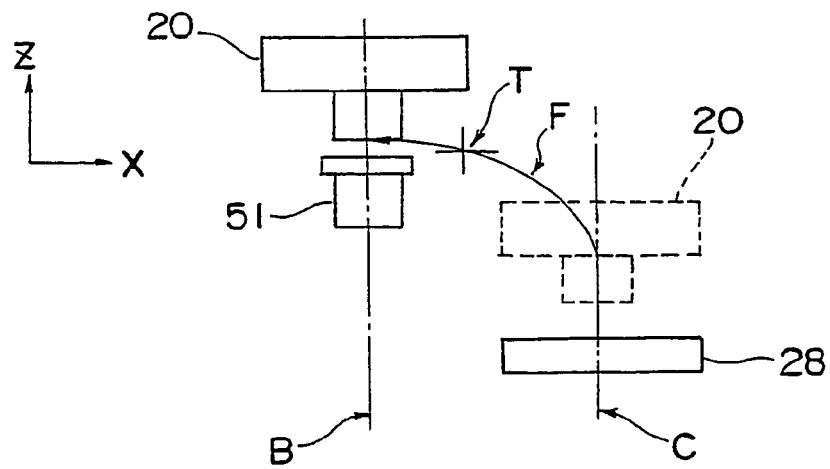

COMPONENT FEEDING HEAD APPARATUS, FOR HOLDING A COMPONENT ARRAYED

TECHNICAL FIELD

The present invention relates to a component feeding head apparatus in which at a component pickup position, a component arrayed in a component arrangement unit is held from a mounting-side surface to be mounted on a substrate, the held component is moved to a component transfer position while the mounting-side surface of the component is inverted, and the component is transferred to a mounting head unit at the component transfer position so as to enable the mounting head unit to mount the component on the substrate, as well as a component feeding apparatus having the component feeding head apparatus, a component mounting apparatus and a method for moving the mounting head unit.

BACKGROUND ART

Conventionally, this kind of component feeding head apparatus has been known to have various structures (see, e.g., Japanese unexamined patent publication No. H11-102936 A). For example, there is a component feeding head apparatus 501 shown in FIG. 12.

As shown in FIG. 12, the component feeding head apparatus 501 has a holding nozzle 502 for holding a component at its top end, and includes a head unit 503 for supporting the holding nozzle 502 so as to allow rotation (so called θ-rotation) of the holding nozzle 502 around its center of axis, a θ-rotating unit 510 for θ-rotation of the holding nozzle 502 around the center of axis, a head inverting unit 520 for rotating the head unit 503 so as to invert it in vertical direction, and a lifting unit 530 for moving the head unit 503 up and down along the center of axis.

As shown in FIG. 12, the head unit 503 includes a ball screw shaft 504 with the holding nozzle 502 fixed to its top end, and a nut 505 fitted to the ball screw shaft 504. Moreover, the θ-rotating unit 510 can transmit a rotational motion of a drive motor to the nut 505 as a reciprocating motion in the vertical direction with use of a cam and cam follower. With the vertical reciprocating motion of the nut 505, the ball screw shaft 504 is rotated around the center of axis, thereby allowing θ-rotation of the holding nozzle 502.

Moreover, as shown in FIG. 12, the θ-rotating unit 510 and the head inverting unit 520 are both supported by a head frame 540, and the head unit 503 is also supported by the head frame 540 in a way that allows inversion. Further, the head lifting unit 530 can move the head unit 503 up and down by moving the head frame 540 up and down.

Moreover, although unshown in FIG. 12, the component feeding head apparatus 501 includes a moving device (unshown) for moving the head unit 503 between a position at which components are picked up by the head unit 503 from a component arrangement unit in the component feeding apparatus having respective components arranged so as to be picked up to a component transfer position at which the picked up components are transferred to a mounting head for mounting the components on a substrate in the component mounting apparatus. The moving device performs the moving operation by moving the head unit 503, the θ-rotating unit 510, the head inverting unit 520, the head frame 540 and the head lifting unit 530 in an integrated manner.

DISCLOSURE OF INVENTION

Currently, in the field of component mounting for producing component-mounted substrates with a plurality of components mounted on a substrate, it is strongly demanded to increase the accuracy of component mounting for enhancing the quality of the component-mounted substrates and to reduce its production cost. As one method for reducing the production cost, component mounting may be implemented faster so as to increase production efficiency. Meanwhile, such faster component mounting makes it necessary to increase the working speed in each constructional sections in the component mounting apparatus, which may cause more frequent generation of vibration, and the generation of vibration may exercise a large influence on the precision of component mounting, resulting in component mounting with degraded precision.

One method for implementing the faster component mounting without degrading the precision of the component mounting may be composed of comparing between a component feeding line that is a movement line of the head unit 503 by the moving device in the component feeding head apparatus 501 (i.e., a movement line from the component pickup position to the component transfer position) and a component mounting line that is a movement line of the mounting head unit (i.e., a movement line from the component transfer position to a mounting position of a component on a substrate), shortening the distance of the component mounting line of the mounting head unit which exerts a direct influence on the component mounting operation while keeping the operation speed low so as to decrease the generation of vibration, and lengthening the distance of the component feeding line of the head unit 503 which exerts less direct influence on the component mounting operation while increasing the operation speed so as to decrease a time necessary for the movement.

In order to implement such a method, it is necessary to allow the head unit 503 in the component feeding head apparatus 501 to move faster and to move to the vicinity of the substrate on which the component is mounted as much as possible (i.e., to the space between the mounting head unit and the substrate in the vicinity of the substrate).

However, in the conventional structure, the component parts which are substantially moved in the component feeding head apparatus 501 include the head unit 503, the θ rotating unit 510, the head inverting unit 520, the head frame 540 and the head lifting unit 530, and therefore implementing the method is difficult as the structure is not compact.

Accordingly, in order to solve the problem, an object of the present invention is to provide a component feeding head apparatus for feeding respective components by holding and moving the respective components fed by a head unit from a component arrangement unit and transferring the held components to a mounting head unit which mounts the components on a substrate, in which the head unit is moved faster and is downsized so as to achieve enhanced precision of component mounting and increased productivity, as well as a component feeding apparatus having the component feeding head apparatus, a component mounting apparatus and a method for moving the mounting head unit.

In accomplishing these objects, the present invention is constituted as shown below.

According to a first aspect of the present invention, there is provided a component feeding head apparatus for holding a component arrayed in a component arrangement unit from a mounting-side surface to be mounted on a substrate at a component pickup position, then transferring the held component to a component transfer position while inverting the mounting-side surface of the component, and then transferring the component to a mounting head unit at the component transfer position so as to mount the component on the substrate by the mounting head unit, comprising:

a head unit having a holding unit for releasably holding the component and a rotating unit for rotating the holding unit around its center of axis;

a head inverting device having a lifting-support-guiding section which supports the head unit in a manner allowing up-and-down movement along the center of axis of the holding unit, for guiding the up-and-down movement, the head inverting device for inverting the head unit at an inversion center arranged in a direction almost orthogonal to the center of axis of the holding unit via the lifting-support-guiding section so as to invert the holding unit in a direction along the center of axis;

a head lifting device for moving the head unit up and down in a direction along the center of axis of the holding unit while being guided by the lifting-support-guiding section so as to move the holding unit up and down;

a head support unit for supporting the head lifting device and the head inverting device; and a head moving device for moving the head support unit between the component pickup position and the component transfer position.

According to a second aspect of the present invention, there is provided the component feeding head apparatus as defined in the first aspect, wherein the head lifting device comprises:

a cam having a center of rotation arranged in a direction almost orthogonal to the center of axis of the holding unit as an eccentric axis, for performing an eccentric rotational motion around the center of rotation;

a lifting driving unit for driving the cam to perform the rotational motion around the center of rotation; and a cam follower provided on the head unit for converting the eccentric rotational motion of the cam to an up-and-down reciprocating motion in a direction along the center of axis of the holding unit.

According to a third aspect of the present invention, there is provided the component feeding head apparatus as defined in the second aspect, wherein the cam has a cam curve portion formed continuously around the eccentric axis for transmitting the rotational motion to the cam follower, and the cam curve portion includes a contact part coming into contact with the cam follower and a contact retreat part formed in succession to the contact part for retreating the contact with the cam follower.

According to a fourth aspect of the present invention, there is provided the component feeding head apparatus as defined in the third aspect, wherein inverting the head unit by the head inverting device is allowed in a state that the contact between the cam and the cam follower in the head lifting device is retreated.

According to a fifth aspect of the present invention, there is provided the component feeding head apparatus as defined in the fourth aspect, wherein the head lifting device further comprises a rotational load unit for imparting a rotational load to the rotational motion of the cam in a state that the contact between the cam and the cam follower is retreated.

According to a sixth aspect of the present invention, there is provided the component feeding head apparatus as defined in the second aspect, wherein the center of rotation of the cam in the head lifting device and the center of inversion of the head inverting device are each arranged in a direction almost orthogonal to a movement direction of the head moving device.

According to a seventh aspect of the present invention, there is provided the component feeding head apparatus as defined in the first aspect, further comprising a head support unit moving device for moving the head support unit in a direction almost orthogonal to the center of axis of the holding unit and almost orthogonal to a movement direction of the head moving device.

According to an eighth aspect of the present invention, there is provided the component feeding head apparatus as defined in the first aspect, wherein the lifting-support-guiding section includes an LM guide having a rail section mounted on either one of the head unit and the head inverting device, and a rail engagement section which is mounted on the other and is movable while being engaged with and guided by the rail section.

According to a ninth aspect of the present invention, there is provided the component feeding head apparatus as defined in the first aspect, further comprising a component recognition device for picking up images of the components arrayed in the component arrangement unit and recognizing arrangement of the components in the component arrangement unit, wherein the component recognition device is supported by the head support unit and the head moving device allows to move the component recognition device together with the head support unit.

According to a tenth aspect of the present invention, there is provided a component feeding apparatus, comprising:

the component feeding head apparatus as defined in the first aspect;

the component arrangement unit for arranging a plurality of the components so as to be picked up by the head unit; and a component feeding/containing unit for containing the respective components in a manner allowing to feed in the component arrangement unit.

According to an eleventh aspect of the present invention, there is provided a component mounting apparatus, comprising:

the component feeding apparatus as defined in the tenth aspect;

the mounting head unit for releasably holding the component;

a substrate holding unit for releasably holding the substrate; and a positioning device for positioning the substrate holding unit and the mounting head unit.

According to a twelfth aspect of the present invention, there is provided a method in which from an upper side of a substrate mounting region where components are mounted on a substrate by a mounting head unit, the mounting head unit is moved to a component transfer position where the component held by an inverting head unit is transferred to the mounting head unit, comprising:

determining a pass point between the substrate mounting region and the component transfer position, at which the mounting head unit will not interfere with the inverting head unit during movement of the mounting head unit;

calculating movement times taken for the mounting head unit, when the mounting head unit is moved, to pass the determined pass point both in a case of movement in a direction along a surface of the substrate and in a case of movement in a direction almost orthogonal to the surface of the substrate;

starting the movement of a longer time among the calculated movement times and calculating a difference between the respective movement times; and starting the other movement so as to move the mounting head unit to the component transfer position via the pass point, after holding up start of the other movement for the difference between the movement times.

According to the first aspect of the present invention, in the component feeding head apparatus, the head unit which is an object subjected to the inverting operation and the up-and-down operation has a minimum structure composed of only a holding unit having a function to hold components and a rotating unit for rotating the holding unit around its center of axis, and the head inverting device performing the inverting operation of the head unit and the head lifting device performing the up-and-down operation are not included in the object but are provided independently of the head unit, which allows the head unit to be downsized.

More particularly, via the lifting-support-guiding section which supports the head unit in a manner allowing up-and-down movement and which can guide the up-and-down movement, the head unit is invertibly supported by the head inverting device, and while being guided by the lifting support guiding section, the head unit can be moved up and down by the head lifting device. This enables the head unit to have a requisite minimum structure, thereby achieving downsizing of the head unit.

Thus, in the component feeding head apparatus, achievement of downsizing of the head unit makes it possible to move the head unit to be moved to the position as close as possible to the mounting position of the components mounted on the substrate by the mounting head unit. Such efforts have conventionally been difficult to achieve.

Consequently, among a component feeding line that is a movement line of the head unit (i.e., a movement line from the component pickup position to the component transfer position) and a component mounting line that is a movement line of the mounting head unit (i.e., a movement line from the component transfer position to a mounting position of the components on the substrate), the distance of the component mounting line of the mounting head unit which exerts a direct influence on the component mounting operation can be set shorter while the operation speed of the mounting head unit is kept low so as to decrease the generation of vibration involved, which achieves enhanced mounting prevision in the component mounting. Further, at the same time, the distance of the component feeding line of the head unit which exerts less direct influence on the component mounting operation (i.e., vibration generated by the movement of the head unit exerts less influence on the mounting head unit and the substrate) can be set longer while the operation speed of the head unit can be increased. This makes it possible to decrease a time necessary for feeding the components to the mounting head unit in the component mounting and to increase productivity in the component mounting. Therefore, it becomes possible to provide the component feeding head apparatus which can achieve and implement both the enhanced prevision in the component mounting and the increased productivity in the component mounting.

According to the second aspect of the present invention, since the head lifting device performing the up-and-down operation of the downsized head section does not have a complicated structure but has a simple structure composed of a cam and a cam follower, the up-and-down operation can be reliably executed, while at the same time, the head lifting device itself can be downsized. Consequently, the moving speed of the head moving device which moves the head lifting device and the head inverting device together with the head unit between the component pickup position and the component transfer position can be increased, thereby making it possible to decrease a time necessary for feeding the components to the mounting head unit.

According to the third aspect, the fourth aspect and the fifth aspect of the present invention, since it is so structured that the contact between the cam and the cam follower in the head lifting device can be retreated, and in this contact avoidance state, the head unit is inverted by the head inverting device, the head inverting device can perform the inverting operation without the inverting operation being disturbed by the head lifting device. By structuring the head lifting device and the head inverting device in this manner, the head lifting device and the head inverting device can be constructed independently of the head unit without being included in the construction of the head unit which is the object of the inverting operation and the up-and-down operation, thereby making it possible to achieve downsizing of the head unit.

Moreover, the contact avoidance state is achieved by the fact that the head unit supported by the head inverting device in a manner allowing up-and-down movement through the lifting-support-guiding section is guided by the lifting-support-guiding section while being constantly biased in upward direction so as to cancel its own weight, and that the upper limit of the biased direction is prescribed.

Moreover, the head lifting device further has a rotational load section for imparting a rotational load to the rotational motion of the cam in the state that the contact between the cam and the cam follower is avoided, and therefore even if the contact is avoided and a load is not generated to the rotational motion of the cam by the contact between the cam and the cam follower, a load can be imparted to the cam by the rotational load section. Therefore, the rotational motion of the cam can be stabilized, and so efficient controllability over the rotational motion can be implemented.

According to the sixth aspect of the present invention, the center of rotation of the cam in the head lifting device and the center of inversion of the head inverting device are each arranged in a direction almost orthogonal to the movement direction of the head moving device, which allows the respective arrangement of the head lifting device and the head inverting device to be more compact. This makes it possible to increase the moving speed of the head unit by the head moving device, and to decrease a time necessary for the head unit to transfer the components to the mounting head unit.

According to the seventh aspect of the present invention, the component feeding head apparatus further has a head support unit moving device for moving the head support unit in a direction almost orthogonal to the center of axis of the holding unit and almost orthogonal to the movement direction of the head moving device, so that positioning of the head unit and the mounting head unit at the component transfer position in this direction can be performed on the side of the component feeding head apparatus. This allows further simplification of the movement line of the mounting head unit, which can reduce vibration and the like generated by the movement and enhance the precision in the component mounting.

According to the eighth aspect of the present invention, the lifting-support-guiding section is an LM guide having a rail section mounted on either one of the head unit and the head inverting device and a rail engagement section mounted on the other and engaged with the rail section while being guided so as to be able to move, which makes it possible to accomplish the effects of the various aspects.

According to the ninth embodiment of the present invention, the component feeding head apparatus further has a component recognition device for taking images of the components arranged in the component arrangement unit and recognizing arrangement of the components in the component arrangement unit, and the component recognition device is supported by the head support unit in the state of being integrated with the head support unit, and can be moved together with the head support unit by the head moving device, so that the moving device of the head unit and the moving device of the component recognition device can be combined and used also as the head moving device. Such a structure, which can be achieved by the fact that the moving speed of the head unit by the head moving device is increased, allows the construction of the component feeding head apparatus to be simplified so as to enhance its reliability and allows the production cost of the device to be reduced.

According to the tenth aspect or the eleventh aspect of the present invention, in the component feeding apparatus and the component mounting apparatus having the component feeding head apparatus offering the effects of the various aspects, an effect to achieve both the enhanced precision of the component mounting and the increased productivity in the component mounting can be gained.

According to the twelfth aspect of the present invention, calculating a pass point between the substrate mounting region and the component transfer position, at which the mounting head unit will not interfere with the inverting head section during movement of the mounting head unit, calculating respective movement times taken for the mounting head unit, when the mounting head unit is moved, to pass the calculated pass point both in a case of movement in a direction along a surface of the substrate and in a case of movement in a direction almost orthogonal to the surface of the substrate, starting the movement of a longer time among the calculated movement times while calculating a difference between the respective movement times, and after holding up start of the other movement for the difference between the travel times, starting the other movement so as to move the mounting head unit to the component transfer position via the pass point makes it possible to reduce a time necessary for the movement and to increase the productivity in the component mounting. Particularly, this can solve the conventional problem that after starting the movement in the direction almost orthogonal to the surface of the substrate, the other movement is started, which always limits the start of the other movement and causes a problem that the time necessary for movement of the mounting head unit cannot be shortened.

BRIEF DESCRIPTION OF DRAWINGS

These and other objects and features of the present invention will become apparent from the following description taken in conjunction with preferred embodiments of the invention with reference to the accompanying drawings, in which:

FIGS. 8A, 8B, 8C and 8D are schematic explanatory views each showing the relation between an inverting head section and the mounting head unit in the respective transfer operations in FIG. 7, in which FIG. 8A shows the state that the inverting head device holds and picks up electronic components at the component pickup position, FIG. 8B shows the state that the inverting head section completes holding and pickup operations of the electronic components and the mounting head unit is positioned at the component transfer position, FIG. 8C shows the state that at the component transfer position, the electronic components are transferred from the inverting head section to the mounting head unit, and FIG. 8D shows the state that the mounting head unit performs mounting of the electronic components, FIG. 9 is a schematic explanatory view showing the operation to move a conventional mounting head unit to the component transfer position;

FIG. 10 is a schematic explanatory view showing the operation to move a conventional mounting head unit to the component transfer position;

FIG. 11 is a schematic explanatory view showing the operation to move the mounting head unit of the first embodiment to the component transfer position;

DETAILED DESCRIPTION OF THE PREFERRED EMBODIMENTS

Figure 1:
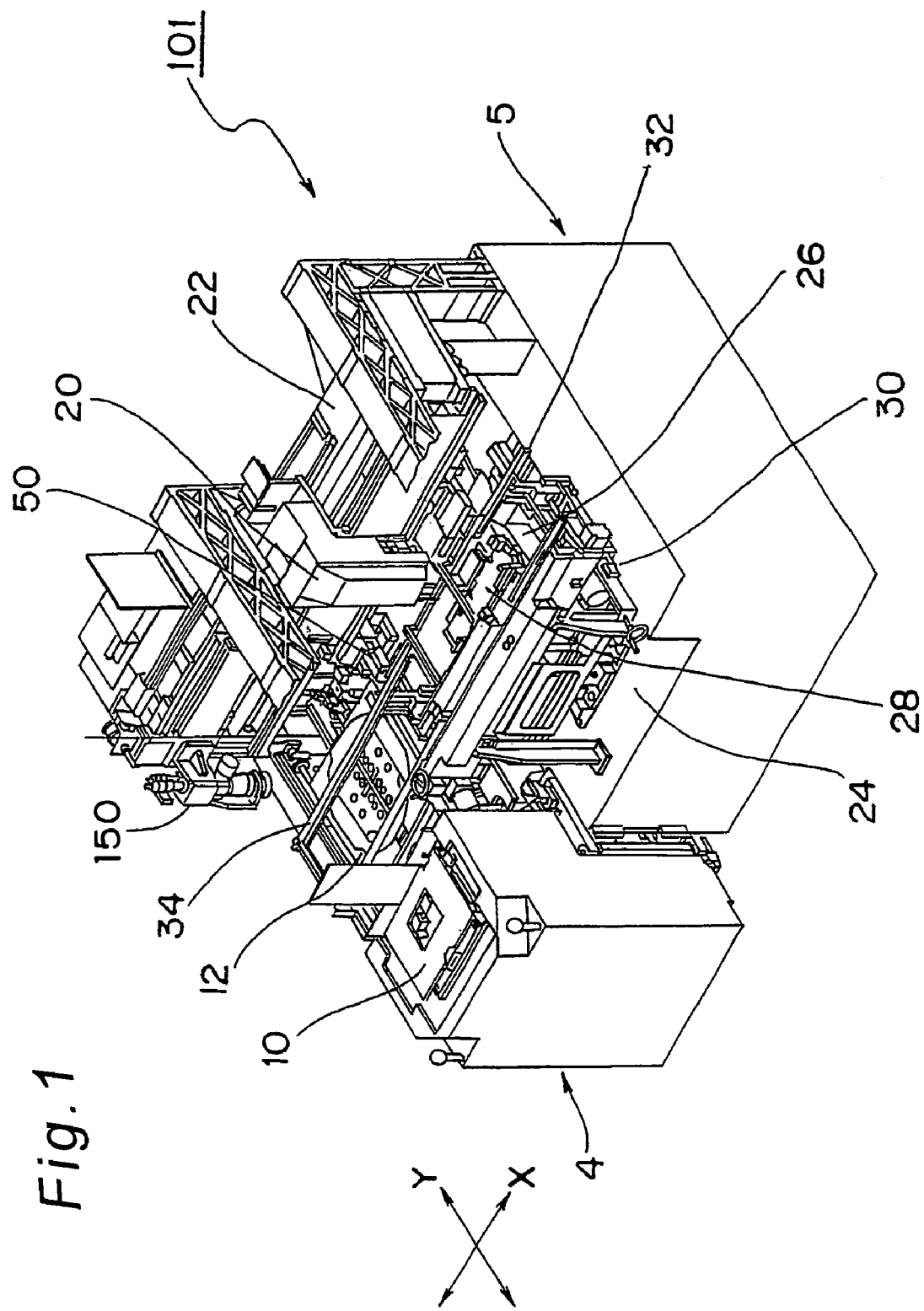
FIG. 1 is a perspective view showing an electronic component mounting apparatus in a first embodiment of the present invention.

Before the description of the present invention proceeds, it is to be noted that like parts are designated by like reference numerals throughout the accompanying drawings.

Hereinbelow, the embodiments of the present invention will be described in detail with reference to the drawings.

FIRST EMBODIMENT

A component feeding head apparatus, a component feeding apparatus having the component feeding head apparatus, and an electronic component mounting apparatus 101 exemplifying the component mounting apparatus according to the first embodiment of the present invention are shown in FIG. 1. Description is first given of the construction and the operation of the electronic component mounting apparatus 101 with reference to FIG. 1.

As shown in FIG. 1, the electronic component mounting apparatus 101 is an apparatus for performing mounting operation to mount electronic components 2 such as chip components and bare IC chips exemplifying the components on a substrate 3, and is roughly composed of a component feeding apparatus 4 which exemplifies the component feeding apparatus for containing a plurality of the electronic components 2 in a feedable manner and a mounting apparatus 5 for performing mounting operation to mount the respective electronic components 2 fed from the component feeding apparatus 4 on the substrate 3.

In the component feeding apparatus 4 shown in FIG. 1, a lifter unit 10 exemplifying the component feeding/containing unit which contains semiconductor wafers with a plurality of electronic components 2 formed thereon or component trays containing a plurality of electronic components 2 arrayed like lattice in a selectively feedable manner is located in the component feeding apparatus 4 on the front side in Y axis direction of the drawing.

The component feeding apparatus 4 also has a fed component arrangement unit 12 exemplifying the component arrangement unit for arranging the semiconductor wafers or the component rays selectively fed from the lifter unit 10 so that the electronic components 2 can be picked up from the respective articles. It is to be noted that in the case where the semiconductor wafers are fed from the lifter unit 10, expanding operation is applied to the semiconductor wafers on the fed component arrangement unit 12.

Further, the component feeding apparatus 4 has an inverting head apparatus 50 for independently sucking and holding the electronic components 2 from the semiconductor wafer or the component tray selectively arranged on the fed component arrangement unit 12, moving the electronic components 2 to the mounting apparatus 5 along X axis direction as viewed in the drawing, and inverting the sucked and held electronic components 2 in vertical direction. It is to be noted that the detailed construction of the inverting head apparatus 50 will be described later.

Moreover, as shown in FIG. 1, the mounting apparatus 5 has a mounting head 20 for sucking and holding the electronic components 2 and mounting them on the substrate 3. Moreover, the mounting apparatus 5 further has an X-axis robot 22 exemplifying the moving device for supporting the mounting head 20 while moving the mounting head 20 backward and forward along X axis direction as viewed in the drawing between a component transfer position at which the electronic components 2 held by the inverting head apparatus 50 can be transferred to the mounting head 20 and a substrate mounting region in which the mounting operation of the electronic components 2 on the substrate 3 is performed, both the positions being assigned along X axis direction as viewed in the drawing. Moreover, the inverting head apparatus 50 can move the held electronic components 2 between a component pickup position above the fed component arrangement unit 12 in the component feeding apparatus 4 and the component transfer position, both the positions being assigned along X axis direction as viewed in the drawing.

Moreover, the mounting head 20 can be driven to move up and down by a moving means such as voice coil motors and has a holding unit (unshown) structured so as to impart junction energy such as pressure energy, supersonic vibration energy and thermal energy to a junction portion between the electronic components 2 and the substrate 3 via the sucked and held electronic components 2, which makes it possible to press the electronic components 2 toward the substrate 3 while imparting the junction energy. Further, the X-axis robot 22 has a movement mechanism (unshown) with use of, for example, a ball screw shaft and a nut fitted with the ball screw shaft.

Moreover, as shown in FIG. 1, an XY table 26 exemplifying the positioning device for moving the substrate 3 in X axis direction and Y axis direction as viewed in the drawing for determining mounting positions of the electronic components 2 on the substrate 3 with respect to the mounting head 20 is located on a base 24 of the mounting apparatus 5 below the mounting head 20 and the X-axis robot 22. The XY table 26 is driven to move both in X axis direction and Y axis direction as viewed in the drawing by, for example, a servomotor, and is also capable of performing positioning by full close control with use of a linear scale. Further, on the top face of the XY table 26, a substrate holding table 28 for releasably holding and securing the substrate 3 is located. It is to be noted that in FIG. 1, the X axis direction and the Y axis direction are directions along the surface of the substrate 3 and also are directions orthogonal to each other.

Moreover, the XY table 26 is equipped with a component image pickup camera 25 exemplifying the component image pickup device. The component image pickup camera 25 can pick up images of the electronic components 2 arranged on the upper side as viewed in the drawing. More specifically, the electronic components 2 sucked and held by the mounting head 20 are positioned above the component image pickup camera 25 by movement of the component image pickup camera 25 in X axis direction or Y axis direction as viewed in the drawing by the XY table 26, so that the images can be picked up. In the electronic component mounting apparatus 101, it is determined based on such images of the electronic components 2 that the electronic components 2 are appropriate for mounting on the cassette 2 or judges the sucking and holding postures of the electronic components 2 by the mounting head 20.

Further, as shown in FIG. 1, the electronic component mounting apparatus 101 is equipped with a substrate transportation unit 30 in an end portion on the front side in Y axis direction on the top face of the base 24 for transporting the substrate 3 toward left-hand side in X axis direction as viewed in the drawing so as to feed the substrate 3 to the substrate holding table 28 and to discharge the substrate 3 from the substrate holding table 28. The substrate transportation unit 30 has a loader 32 exemplifying the loader unit for transporting and feeding the substrate 3 from the end portion on the light-hand side in X axis direction as viewed in the drawing to the substrate holding table 28 on the XY table 26 in the electronic component mounting apparatus 101, and an unloader 34 exemplifying the unloader unit for transporting and discharging the substrate 3 from the substrate holding table 28 to the end portion on the left-hand side in X axis direction in the electronic component mounting apparatus 101 as viewed in the drawing. It is to be noted that in the first embodiment, the XY table 26 and the substrate holding table 28 in the electronic component mounting apparatus 101 exemplify the substrate holding/moving device for performing the movement and holding of the substrate 3.

Description is now given of the mounting operation of the electronic components 2 on the substrate 3 in the electronic component mounting apparatus 101 having such structure.

In the electronic component mounting apparatus 101 in FIG. 1, the substrate holding table 28 is moved by the XY table 26 so as to be positioned between the loader 32 and the unloader 34 on the base 24. Along with the movement, the substrate 3 on which the electronic components 2 should be mounted in the electronic component mounting apparatus 101 is fed to the loader 32 in the substrate transportation unit 30 by, for example, another apparatus or the like adjacent to the electronic component mounting apparatus 101, and the substrate 3 is transported by the loader 32 in substrate transportation direction B so that the substrate 3 is fed to the substrate holding table 28 and held there. After that, the XY table 26 is moved in X axis direction or Y axis direction as viewed in the drawing so that the substrate 3 is moved to the substrate mounting region.

In the meantime, in the component feeding apparatus 4, the respective electronic components 2 arranged on the fed component arrangement unit 12 are sucked and held so as to be picked up at the component pickup position by the inverting head apparatus 50. In the inverting head apparatus 50, the electronic component 2 is inverted and moved from the component pickup position to the component transfer position. Moreover, in the mounting apparatus 5, the mounting head 20 is moved to the component transfer position by the X-axis robot 22, and the electronic component 2 is transferred from the inverting head apparatus 50 to the mounting head 20. After that, the mounting head 20 in the state of sucking and holding the transferred electronic component 2 is moved to the upper side of the substrate mounting region by the X-axis robot 22.

After that, in the substrate mounting region, the component image pickup camera 25 is moved to the lower side of the electronic component 2 in the state of being sucked and held by the mounting head 20 by the XY table 26, and an image of the electronic component 2 is picked up. Based on the picked up image, it is determined whether or not mounting of the electronic component 2 on the substrate 3 is appropriate, and θ-correction of the sucking and holding posture or the like is performed.

After that, if the electronic component 2 is determined to be appropriate for the mounting, then the electronic component 2 sucked and held by the mounting head 20 is positioned at a position where the electronic component 2 should be mounted on the substrate 3 held by the substrate holding table 28 by the movement of the XY table 26. After the positioning, up-and-down operation of the mounting head 20 or the like is performed and the mounting operation of the electronic component 2 on the substrate 3 is performed. In the case where the mounting operation of a plurality of the electronic components 2 is performed, the respective operations are repeatedly executed for achieving the mounting operation of the respective electronic components 2.

After that, upon completion of the mounting operation of the respective electronic components 2, the substrate 3 with the respective electronic components 2 mounted thereon is moved together with the substrate holding table 28 to the position between the loader 32 and the unloader 34 by the XY table 26, the substrate 3 is transferred from the substrate holding table 28 to the unloader 34, the substrate 3 is transported by the unloader 34, and the substrate 3 is discharged out of the electronic component mounting apparatus 101. The discharged substrate 3 is, for example, fed to another apparatus located adjacent to the electronic component mounting apparatus 101 for performing the next processing and the like in the component mounting, or stored in a substrate storage device and the like as the substrate 3 with component mounting completed.

Thus, in the electronic component mounting apparatus 101, the mounting operation of the respective electronic components 2 on the substrate 3 is performed. It is to be noted that after the substrate 3 with the respective electronic components 2 mounted thereon is discharged, another new substrate 3 is fed to the loader 32, by which the respective electronic components 2 are mounted on the respective substrates 3 which are fed in sequence.

Figure 2:
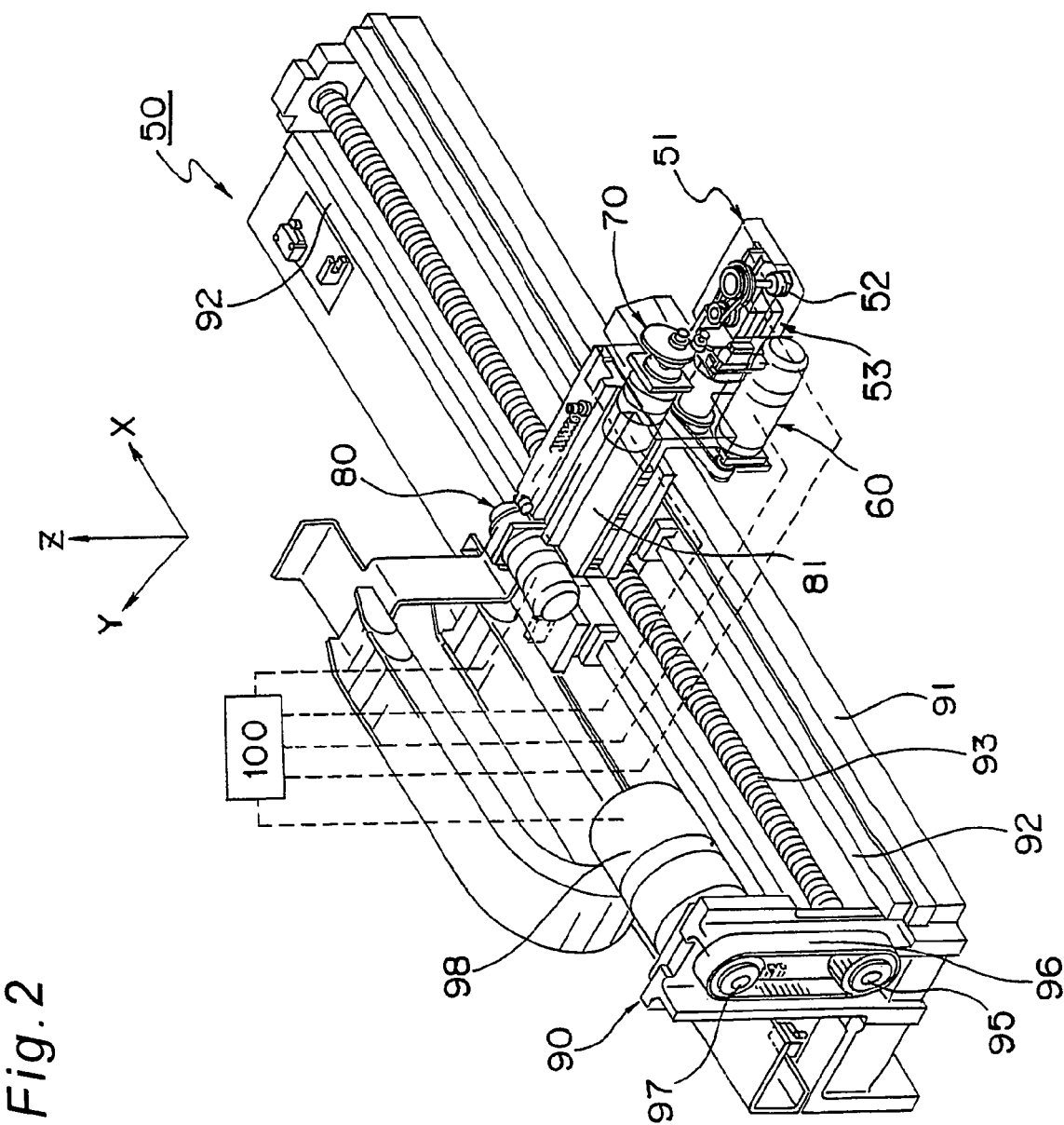
FIG. 2 is a perspective view showing an inverting head device included in the electronic component mounting apparatus.

Description is now given of the detailed construction of the inverting head apparatus 50 with reference to FIG. 2 showing a fragmentary semipermeable perspective view of the inverting head apparatus 50 included in the component feeding apparatus 4 in the electronic component mounting apparatus 101.

As shown in FIG. 2, the inverting head apparatus 50 has an inverting head 51 exemplifying the head unit includes a suction nozzle 52 exemplifying the holding unit for releasably sucking and holding the electronic component 2 and a θ-rotating unit 53 exemplifying the rotating unit for allowing rotation (so called θ rotation) of the suction nozzle 52 around its center of axis. Moreover, the inverting head apparatus 50 has a head lifting device 70 for moving the inverting head 51 up and down along the center of axis of the suction nozzle 52 so as to move the suction nozzle 52 up and down, a head inverting device 60 for supporting the inverting head 51 in a manner allowing up-and-down movement while rotating the inverting head 51 around the center of inversion arranged in Y axis direction as viewed in the drawing which is the direction almost orthogonal to the center of axis of the suction nozzle 52 so as to invert the suction nozzle 52 in the direction along the center of axis, and a head frame 81 exemplifying the head support unit for supporting the head lifting device 70 and the head inverting device 60. Further, the inverting head apparatus 50 has a head moving device 90 for moving the head frame 81 forward and backward in X axis direction as viewed in the drawing, and by the movement, the inverting head 51 can be moved forward and the backward between the component pickup position positioned in the vicinity of the end portion on the left-hand side in X axis direction as viewed in the drawing and the component transfer position positioned in the vicinity of the end portion on the right-hand side in X axis direction as viewed in the drawing. It is to be noted that in FIG. 2, the center of axis of the suction nozzle 52 is positioned in Z axis direction as viewed in the drawing, and the Z axis direction is the direction orthogonal to X axis direction and Y axis direction as viewed in the drawing.

Figure 3:
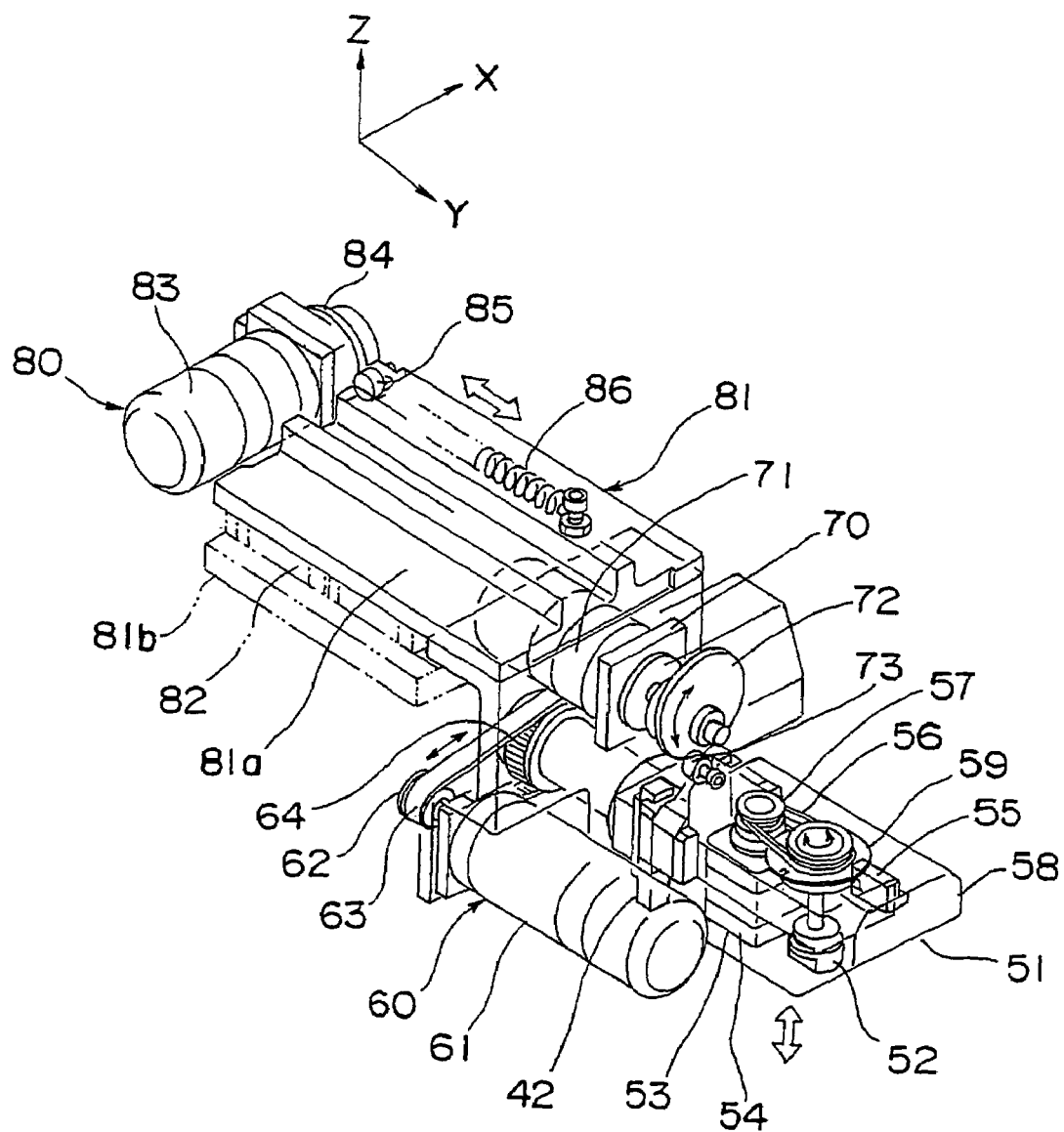
FIG. 3 is a fragmentary enlarged perspective view showing the inverting head device.
Figure 4:
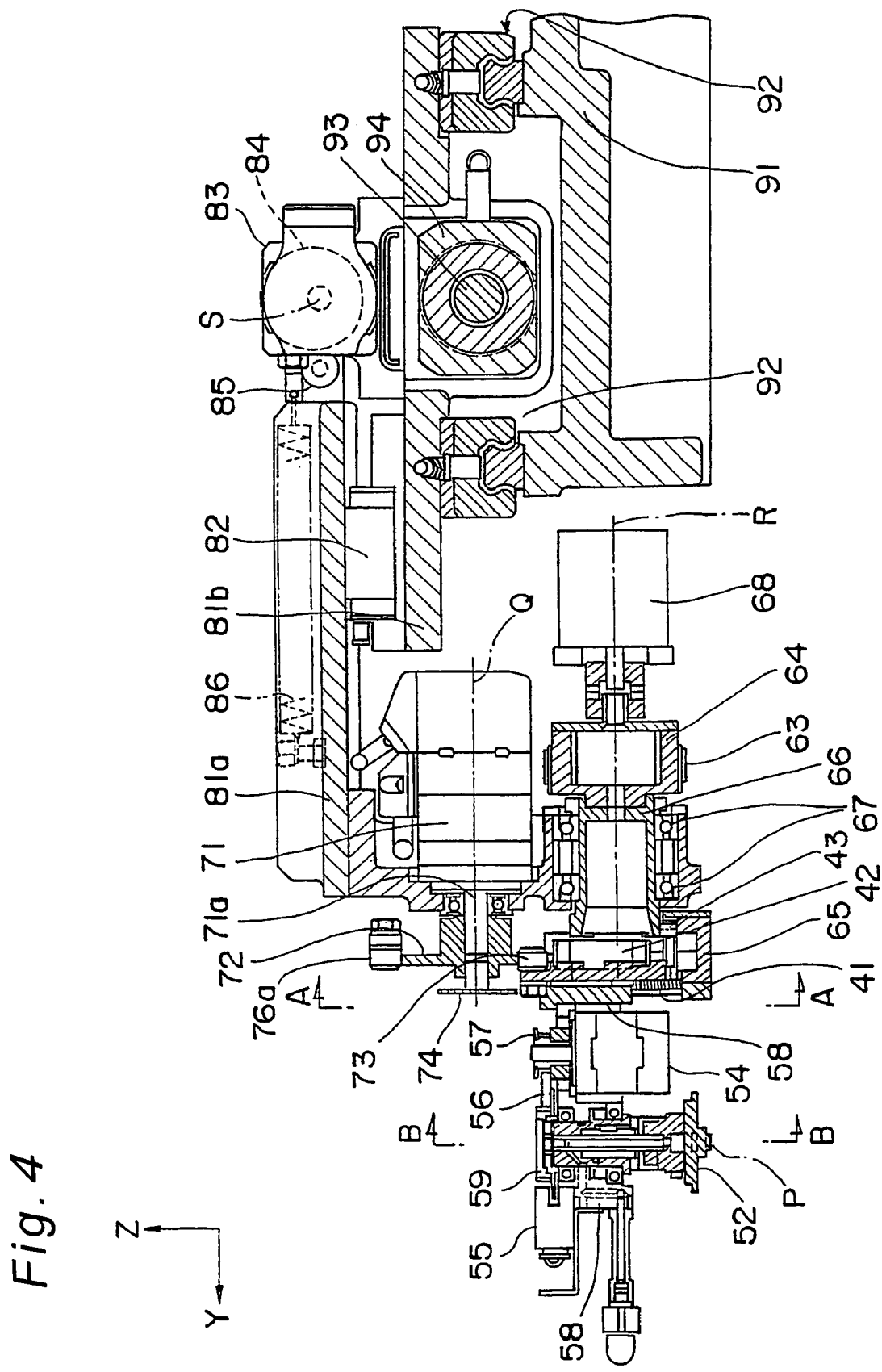
FIG. 4 is a cross sectional view showing the inverting head device of FIG. 2 in X axis direction.
Figure 5:
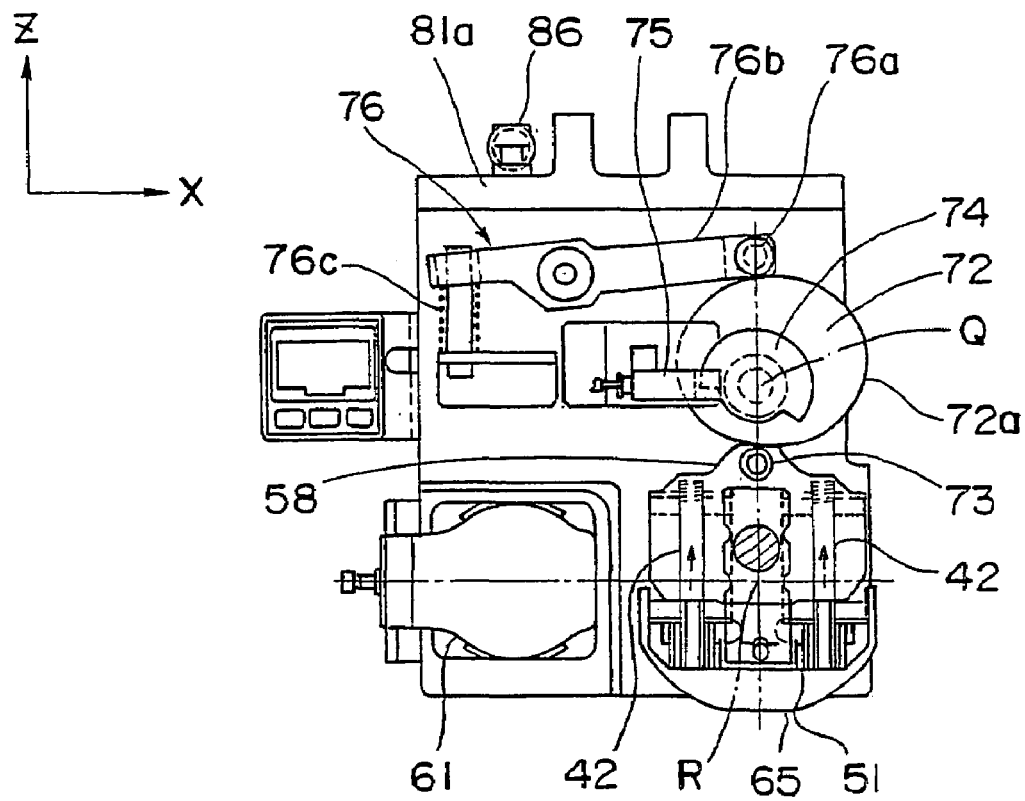
FIG. 5 is a perspective view showing the inverting head device of FIG. 4 taken along an allow A-A.
Figure 6:
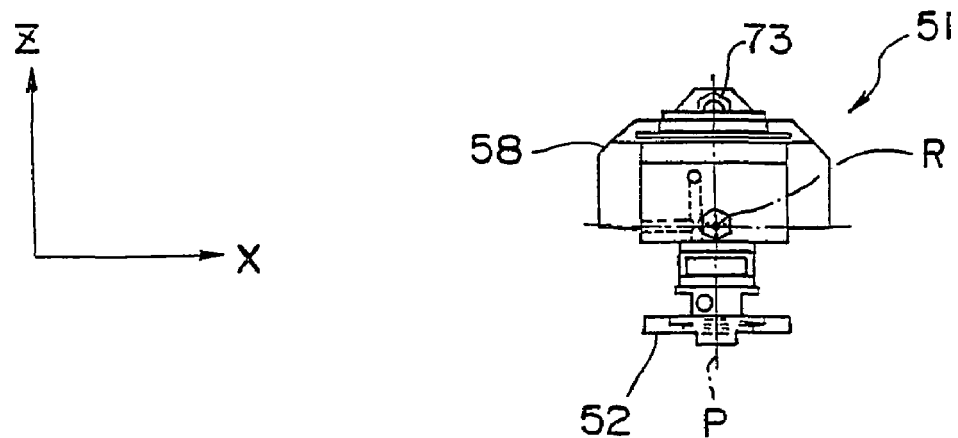
FIG. 6 is a perspective view showing the inverting head device of FIG. 4 taken along an allow B-B.

With regard to the inverting head apparatus 50 having such construction, a fragmentary semipermeable enlarged perspective view of a portion moved by the head moving device 90 is shown in FIG. 3. Moreover, a cross sectional view of the inverting head apparatus 50 of FIG. 3 in X axis direction as viewed in the drawing is shown in FIG. 4, a perspective view of FIG. 4 taken along an arrow A-A is shown in FIG. 5, and a perspective view of FIG. 4 taken along an arrow B-B is shown in FIG. 6. With reference to these FIG. 3 through FIG. 6, the further specific construction of the inverting head apparatus 50 will be described below.

First, in the inverting head 51, the suction nozzle 52 is supported rotatably around its center of axis P by a nozzle support section 58 via a plurality of bearing sections. The suction nozzle 52 can hold the electronic component 2 releasably in the lower top end as viewed in the drawing with use of, for example, vacuum suction and the like. Moreover, on the upper end portion of the center of axis P of the suction nozzle 52 as viewed in the drawing, a pulley 59 is fixed rotatably around the center of axis P. Moreover, in the nozzle support section 58, there is a θ-rotation motor 54 having a drive shaft located in the direction along the center of axis P of the suction nozzle 52, and a pulley 57 is also fixed onto the upper end portion of the drive shaft as viewed in the drawing, with its arrangement height position being almost equal to that of the pulley 59. Further, the pulley 59 and the pulley 57 are engaged with a belt 56, and by rotational driving of the θ rotation motor 54 in either forward or backward rotational direction, the rotation of the pulley 57 around the drive shaft is transmitted to the pulley 59 through the belt 56, so that the pulley 59 can be rotated around the center of axis P in either forward or backward direction. This allows rotation of the suction nozzle 52 around the center of axis P, i.e., θ-rotation. Moreover, on the left-hand side of the pulley 59 as viewed in FIG. 4, an origin sensor 55 for detecting the position of an origin in rotational direction of the pulley 59 is provided, which makes it possible to detect the position of an origin in the θ-rotation of the suction nozzle 52. It is to be noted that in the first embodiment, the θ-rotating unit 53 has the θ rotation motor 54, the origin sensor 55, the pulleys 57, 59 and the belt 56.

Further, the head inverting device 60 has an inversion shaft 66 which is supported rotatably around an inversion axis R that is the center of its axis via a plurality of bearings 67 below the head frame 81. It is to be noted that the inversion axis R is arranged along Y axis direction as viewed in the drawing, and is further arranged so as to be perpendicular to the center of axis P of the suction nozzle 52. Moreover, in FIG. 4, on the end portion on the left-hand side of the inversion shaft 66 as viewed in the drawing, via an LM guide 42 exemplifying the lifting-support-guiding section constructed movably in Z axis direction as viewed in the drawing, the nozzle support section 58 of the inverting head 51 is mounted. It is to be noted that such an LM guide 42 is constituted of a rail section fixed to the inversion shaft 66 and a rail engagement section fixed to the nozzle support section 58 and engaged with the rail section, so that the rail engagement section can be supported and guided by the rail section. Moreover, a spring bearing 65 is fixed to the lower end portion of the inversion shaft 66 as viewed in FIG. 4, and a spring 41 is provided between the upper side of the spring bearing 65 and the lower side of the nozzle support section 58. By the spring 41, the nozzle support section 58 is constantly biased upward along the LM guide 42, i.e., in Z direction. Moreover, a stopper 43 is mounted on the nozzle support section 58, and the stopper 43 sets an upper limit of the position biased upward as viewed in the drawing along the LM guide 42 by the spring 41. Therefore, with the upper limit set position as an upper limit position of its up-and-down operation, the nozzle support section 58 is lowered downward from the upper limit position as viewed in the drawing.

Further, as shown in FIG. 4, on the end portion on the right-hand side of the inversion shaft 66 as viewed in the drawing, a pulley 64 with its inversion axis R as the center of rotation is mounted. Moreover, as shown in FIG. 3, an inverting motor 61 is located on the head frame 81 with its drive shaft located in Y axis direction as viewed in the drawing so as to be almost parallel to and at the same height with the inversion axis R. As shown in FIG. 3, on the end portion on the left-hand side in Y axis direction of the drive shaft of the inverting motor 61 as viewed in the drawing, a pulley 62 sharing the center of rotation with the drive shaft is mounted. Moreover, the respective pulleys 62 and 64 are arranged so as to be in the same position in terms of Y axis direction. Further, the pulley 62 and the pulley 64 are engaged with a belt 63, and by rotational driving of the inverting motor 61 in either forward or backward rotational direction, the rotation of the pulley 62 around the drive shaft is transmitted to the pulley 64 through the belt 63, so that the pulley 64 can be rotated around the inversion axis R in either forward or backward direction. Consequently, the inversion shaft 66 is rotated around the inversion axis R, and so the nozzle support section 58 can be rotated via the LM guide 42 in either forward or backward direction, i.e., the inverting head 51 can be rotated. Thus, by rotating the inverting head 51, the suction nozzle 52 can be inverted in the direction along the center of axis P. It is to be noted that in FIG. 4, on the right-hand side of the pulley 64 as viewed in the drawing, a slip ring 68 is provided, and through the slip ring 68, control signals and power lines are transferred to the θ-rotating unit 53 of the inverting head 51. It is to be noted that in the first embodiment, the head inverting device 60 has the inverting motor 61, the pulleys 62, 64, the belt 63, the inversion shaft 66, the spring bearing 65 and the slip ring 68.

Moreover, the head lifting device 70 has a lifting motor 71 exemplifying the lifting driving device having a drive shaft 71a arranged above the inversion axis R of the head inverting device 60 in Z axis direction as viewed in the drawing and along Y axis direction as viewed in the drawing, the lifting motor 71 being fixed to the head frame 81. Moreover, on the drive shaft 71a of the lifting motor 71, a lifting cam 72 exemplifying the disk-like cam which uses the center of axis of the drive shaft 71a as the center of eccentric rotation (eccentric axis Q) and rotates together with the drive shaft 71a around the eccentric axis Q for providing an eccentric rotational motion is mounted. Moreover, on the upper side of the nozzle support section 58 of the inverting head 51, a lifting cam follower 73 exemplifying the cam follower capable of coming into contact with an outer peripheral portion 72a of the lifting cam 72 is mounted. It is to be noted that the lifting cam follower 73 may be like a rotatable roller or may be secured so as not to be rotated. Consequently, by rotational driving of the lifting motor 71 in either forward or backward direction around the drive shaft, an eccentric rotational motion of the lifting cam 72 around the eccentric axis Q is performed, and the rotational motion can be converted by the lifting cam 72 to a reciprocating movement in Z axis direction as viewed in the drawing. Moreover, such a reciprocating movement is transmitted to the nozzle support section 58 and so the nozzle support section 58 is guided by the LM guide 42 in its movement direction while the inverting head 51 is moved up and down along Z axis direction as viewed in the drawing, i.e., along the center of axis P. It is to be noted that an amount of the up-and-down operation of such inverting head 51 is equal to, as shown in FIG. 5, an amount of change by rotation in the eccentric axis Q in the lifting cam 72 and the lifting cam 72 having a size from the eccentric axis Q toward the outer peripheral portion 72a positioned downward in Z axis direction as viewed in the drawing.

Moreover, as shown in FIG. 5, in the first embodiment, the outer peripheral portion 72a of the lifting cam 72 exemplifies the cam curve portion formed continuously around the eccentric axis Q. Further, out of the entire outer periphery, the outer peripheral portion 72a is constituted of a contact part coming into contact with the lifting cam follower 73 and a contact retreat part formed in succession to the contact part for retreating the contact with the lifting cam follower 73.

More specifically, by the rotation in the lifting cam 72, the outer peripheral portion 72a is in the state of being reliably in contact with the lifting cam follower 73 if the contact part is positioned, among the outer peripheral portion 72a, at a downward position in Z axis direction as viewed in the drawing, and by the rotation of the lifting cam 72 in this contact state, the lifting cam follower 73 is moved up and down.

In the meantime, in the lifting cam 72, if the contact retreat part among the outer peripheral portion 72a is positioned at a downward position in Z axis direction as viewed in the drawing, a space to prevent contact between the outer peripheral portion 72a and the lifting cam follower 73 is secured therebetween. More particularly, at the upper limit position set by the stopper 43 for the up-and-down movement of the nozzle support section 58 in the state of being constantly biased upward by the spring 41, the space is secured between the lifting cam follower 73 and the outer peripheral portion 72a of the lifting cam 72. Thus, securing the space allows the head lifting device 70 to be cut away from the inverting head 51 and allows the head inverting device 60 to smoothly invert the inverting head 51. It is to be noted that the inverting head 51 is formed such that if the inverting head 51 is inverted in this state, the inverting head 51 will not come into contact with the lifting cam 72. It is to be noted that in the first embodiment, a space of about, for example, 0.05 mm size can be secured as such space. Moreover, in the head lifting device 70, the contact retreat part on the outer peripheral portion 72a positioned at the downward position in Z axis direction as viewed in the drawing is set at the position of a cam origin in the lifting cam 72. Therefore, only when the lifting cam 72 is positioned at the cam origin position, the head inverting device 60 is allowed to invert the inverting head 51.

Moreover, as shown in FIG. 4 and FIG. 5, in the head lifting device 70, a dog 74 for detecting cam curve line effective range to regulate the range of the movement of the outer peripheral portion 72a by the rotation of the lifting cam 72 is mounted on the top end of the drive shaft 71a. The dog 74 has an almost disc-like shape having a notch portion on a part of its outer peripheral section, and can rotate around the eccentric axis Q along with the rotation of the lifting cam 72. Moreover, on the head frame 81, a sensor 75 for detecting cam curve effective range is mounted, the sensor 75 detecting the presence of the notch portion on the outer peripheral portion of the dog 74 so as to detect the movement position of the outer peripheral portion 72a of the lifting cam 72 and to limit the movement range within the cam curve effective range. This makes it possible to limit the rotation range of the lifting cam 72 within the cam curve effective range, allowing the up-and-down operation of the inverting head 51 to be surely performed.

Moreover, as shown in FIG. 4 and FIG. 5, a rotational load mechanism 76 exemplifying the rotational load unit for imparting a predetermined load to the rotation of the lifting cam 72 for the purpose of providing efficient controllability over the rotational position in the rotation of the lifting cam 72 is mounted on the head frame 81. The rotational load mechanism 76 includes a load lever 76b having a load cam follower 76a formed on its top end and coming into contact with the outer peripheral portion 72a of the lifting cam 72 on the upper side in Z axis direction as viewed in the drawing, and a spring 76c biasing so that the load cam follower 76a is constantly in contact with the outer peripheral portion 72a of the lifting cam 72 with the vicinity of the near center of the load lever 76b as a supporting point. The biasing force of the spring 76c can be constantly transmitted to the lifting cam 72 by the load cam follower 76a via the load lever 76b, so that a predetermined load is constantly imparted to the rotation of the lifting cam 72. Consequently, if a space is secured between the lifting cam 72 and the lifting cam follower 73 so that a rotational load produced by the contact therebetween is not generated, a rotational load can be imparted to the lifting cam 72 by the rotational load mechanism 76, thereby making it possible to stabilize the rotation of the lifting cam 72 and to implement efficient controllability over the rotation amount.

Next, as shown in FIG. 4, the head frame 81 includes a Y-axis direction movable frame 81a supporting the inverting head 51, the head lifting device 70 and the head inverting device 60 and being able to move in Y axis direction as viewed in the drawing, and an X-axis direction movable frame 81b supporting the Y-axis direction movable frame 81a movably in the Y axis direction and being able to move in X axis direction as viewed in the drawing. The Y-axis direction movable frame 81a is mounted on the top face of the X-axis direction movable frame 81b via an LM guide 82 located in Y axis direction as viewed in the drawing, and can move in Y axis direction as viewed in the drawing while being guided by the LM guide 82. Also, the X-axis direction movable frame 81b is mounted on two LM guides 92 located on a base frame 91 of the head moving device 90 in X axis direction as viewed in the drawing, and can move in X axis direction while being guided by the respective LM guides 92.

Further, as shown in FIG. 2, the head moving device 90 has a ball screw shaft 93 located on the top face of the base frame 91 along X axis direction as viewed in the drawing. The ball screw shaft 93 is rotatably fixed to the base frame 91 in the vicinity of both the end portions in X axis direction as viewed in the drawing. Further, the head moving device 90 has a nut 94 fitted with the ball screw shaft 93 (see FIG. 4), and the X-axis direction movable frame 81b is mounted on the nut 94. Moreover, as shown in FIG. 2, the head moving device 90 has a pulley 95 mounted on the left-side end portion of the ball screw shaft 93 in X axis direction as viewed in the drawing and sharing the center of rotation with the ball screw shaft 93, a movement motor 98 having a drive shaft located above the center of axis of the ball screw shaft 93 in X axis direction as viewed in the drawing, a pulley 97 mounted on the end portion of the drive shaft of the movement motor 98, and a belt 96 engaged with the respective pulleys 95 and 97. The pulley 95 and the pulley 97 are arranged so that their arrangement positions in X axis direction as viewed in the drawing are identical. With such construction of the head moving device 90, the movement motor 98 is rotationally driven in either forward or backward rotational direction so as to rotate the pulley 97 around the center of axis, by which the pulley 95 can be rotated in either forward or backward direction via the belt 96. Consequently, the ball screw shaft 93 is rotated in either forward or backward direction, so that the nut 94 fitted therewith can be moved forward and backward along X axis direction as viewed in the drawing, and so the head frame 81 can be moved forward and backward along X axis direction as viewed in the drawing, by which the inverting head 51 is moved along X axis direction as viewed in the drawing.

Moreover, the inverting head apparatus 50 is structured such that the X direction as viewed in the drawing is longer than the Y axis direction as viewed in the drawing. With this structure, along with the movement of the inverting head 51 in X axis direction as viewed in the drawing by the head moving device 90, a displacement of the movement may occur with respect to the direction of the inverting head 51 in Y axis direction as viewed in the drawing. Such displacement may be generated by a production error of the ball screw shaft 93 in the head moving device 90 or a production error of the LM guides 92. Moreover, it may be necessary to provide the inverting head apparatus 50 with a device capable of performing fine adjustment of a transfer position in Y axis direction as viewed in the drawing when the electronic component 2 sucked and held by the inverting head 51 is transferred to the mounting head 20.

Under these circumstances, the inverting head apparatus 50 has an Y-axis direction correction device 80 exemplifying the head support unit moving device for moving the position of the inverting head 51 in Y axis direction as viewed in the drawing so as to correct the position in the direction. As shown in FIG. 3 and FIG. 4, the Y-axis direction correction device 80 includes a correction motor 83 mounted on the top face of the X-axis direction movable frame 81b with its drive shaft being located along X axis direction as viewed in the drawing, a correction cam 84 using the drive shaft of the correction motor 83 as the center of eccentric rotation (eccentric axis S) and performing an eccentric rotational motion around the eccentric axis S, and a correction cam follower 85 mounted on the right-hand end of the Y-axis direction movable frame 81a in FIG. 4 and being in contact with the outer peripheral portion of the correction cam 84. Moreover, a spring 86 is mounted such that one end is fixed to the Y-axis direction movable frame 81a and the other end is fixed to the X-axis direction movable frame 81b, and by tensile force of the spring 86, the contact between the correction cam 84 and the correction cam follower 85 are in the state of being constantly biased. With thus-structured Y-axis direction correction device 80, it becomes possible to drive the correction motor 83 to rotate in either forward or backward direction so as to provide an eccentric reciprocating motion of the correction cam 84 around the eccentric axis S, convert the rotational motion to a reciprocal motion in Y axis direction as viewed in the drawing by the correction cam follower 85, and to move the Y-axis direction movable frame 81a in Y axis direction as viewed in the drawing while guiding the Y-axis direction movable frame 81a by the LM guide 82. This makes it possible to correct the arrangement position of the inverting head 51 in Y axis direction as viewed in the drawing.

Further, as shown in FIG. 1, the component feeding apparatus 4 has a recognition camera device 150 exemplifying the recognition device for picking up images of the respective electronic components 2 arranged on the fed component arrangement unit 12 and recognizing the arrangement positions of the respective electronic components 2. Such recognition camera device 150 makes it possible to move the inverting head 51 by the head moving device 90 based on the recognition result and to suck and pickup the electronic components 2 arranged on the fed component arrangement unit 12 by the inverting head 51.

Figure 13:
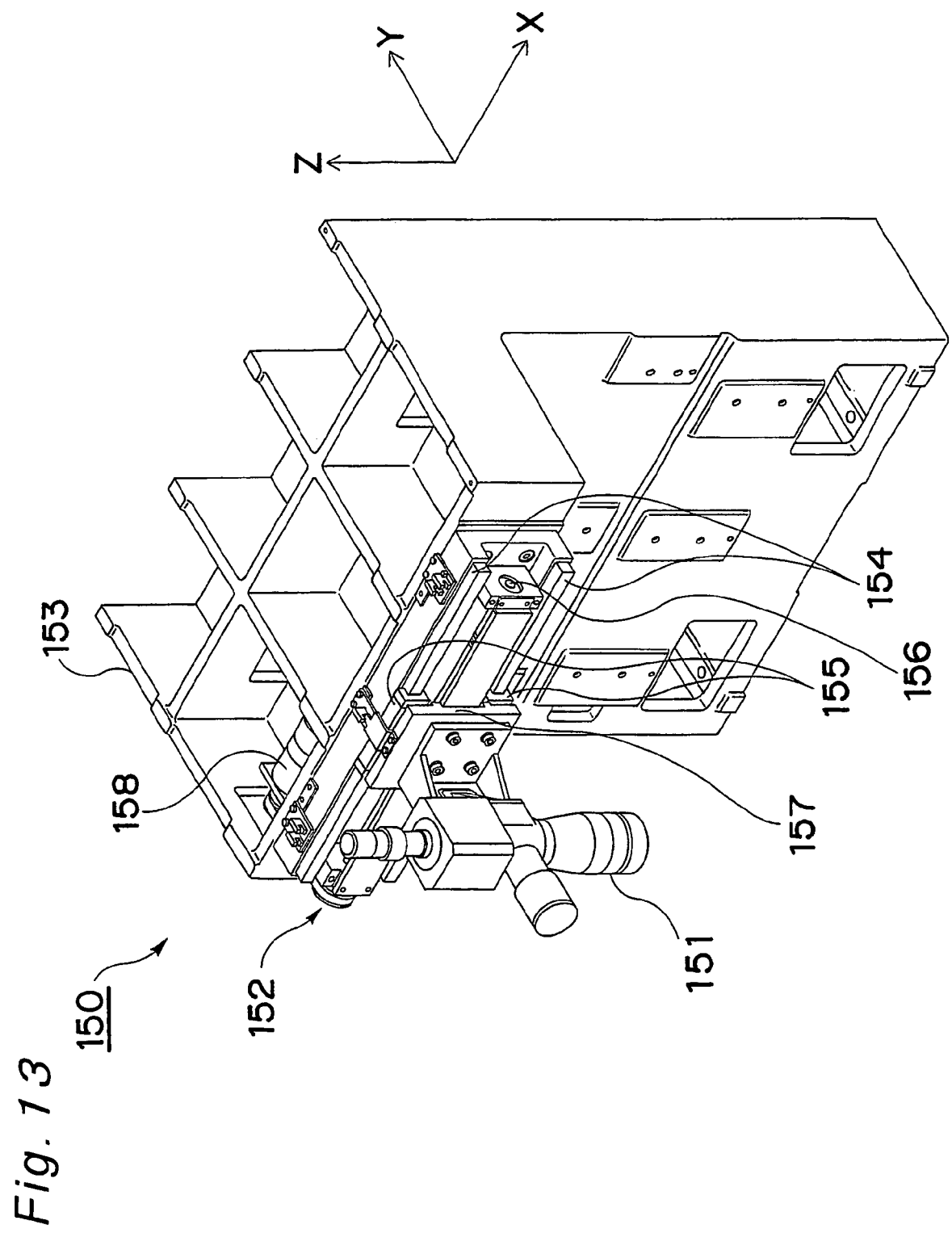
FIG. 13 is a perspective view showing a recognition camera device having a component feeding apparatus of the first embodiment.

Herein, an enlarged perspective view showing the recognition camera device 150 is shown in FIG. 13. As shown in FIG. 13, the recognition camera device 150 includes a camera 151 for picking up an image of the electronic component 2 arranged directly underneath the camera 151, a camera moving device 152 for supporting the camera 151 movably in X axis direction as viewed in the drawing while moving the camera 151, and a support frame 153 for supporting the camera moving device 152. The camera moving device 152 is engaged with an LM rail 154 arranged along X axis direction as viewed in the drawing movably along the LM rail 154, and has an LM block 155 fixed onto the camera 151. Further, the camera moving device 152 includes a ball screw shaft 156 arranged along X axis direction as viewed in the drawing and fixed to the support frame 153 rotatably around its center of axis, a nut 157 fitted with the ball screw shaft 156 and fixed to the camera 151, and a drive motor 158 for driving the ball screw shaft 156 to rotate around the center of axis.

In such structured recognition camera device 150, by driving the ball screw shaft 156 to rotate in either forward or backward direction around its center of axis by the drive motor 158, the camera 151 fixed to the nut 157 can be moved forward and backward along the LM rail 154 in X axis direction as viewed in the drawing. This makes it possible to position the camera 151 above the electronic component 2 arranged on the fed component arrangement unit 12 so that an image of the electronic component 2 can be picked up by the camera 151 and the arrangement position of the electronic component 2 can be recognized based on the image.

Moreover, the electronic component mounting apparatus 101 has a mounting control unit for performing comprehensive control by associating the respective component parts to each other, and the mounting control unit comprehensively controls operations in the component feeding apparatus 4 and the mounting apparatus 5. Moreover, as shown in FIG. 2, an inverting head apparatus 50 has an inverting head control unit 100 subjected to comprehensive control by the mounting control unit. The inverting head control unit 100 can comprehensively control respective operations including the sucking and holding operation by the suction nozzle 52, the θ-rotation operation by the θ-rotating unit 53, the inverting operation of the inverting head 51 by the head inverting device 60, the up-and-down operation of the inverting head 51 by the head lifting device 70, the correcting operation of the arrangement position of the inverting head 51 in Y axis direction as viewed in the drawing by the Y-axis direction correction device 80, and the moving operation of the inverting head 51 in X axis direction as viewed in the drawing by the head moving device 90 while associating the respective operations to each other. It is to be noted that the inverting head control unit 100 can control the respective operations including the moving operation of the camera 151 by the camera moving device 152 in the recognition camera device 150, the image pickup operation of the electronic components 2 by the camera 151, and the recognition and processing operation of the picked up images, and control of these operations can also be executed while being associated to each other.

Figure 7:
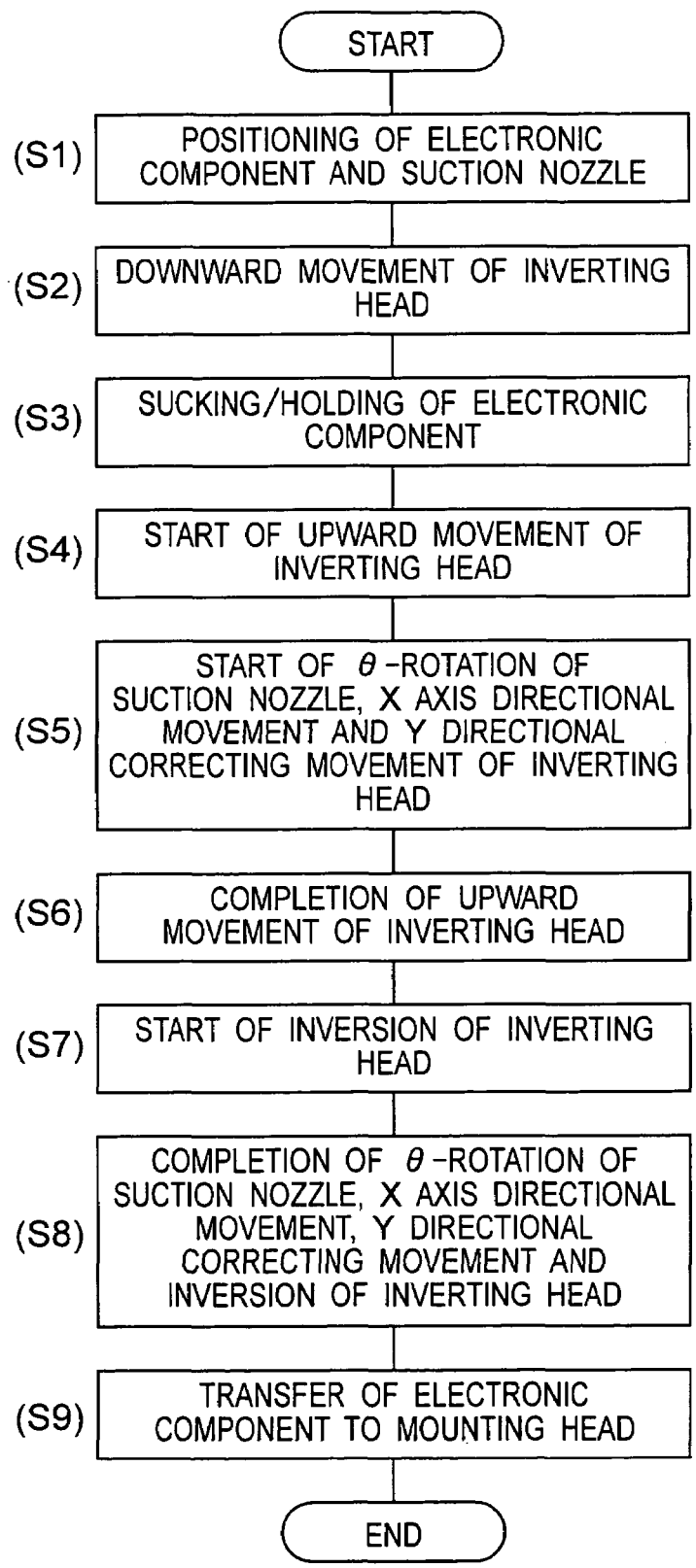
FIG. 7 is a flowchart showing operation procedures for transferring electronic components in the inverting head device to a mounting head unit.
Figure 12:
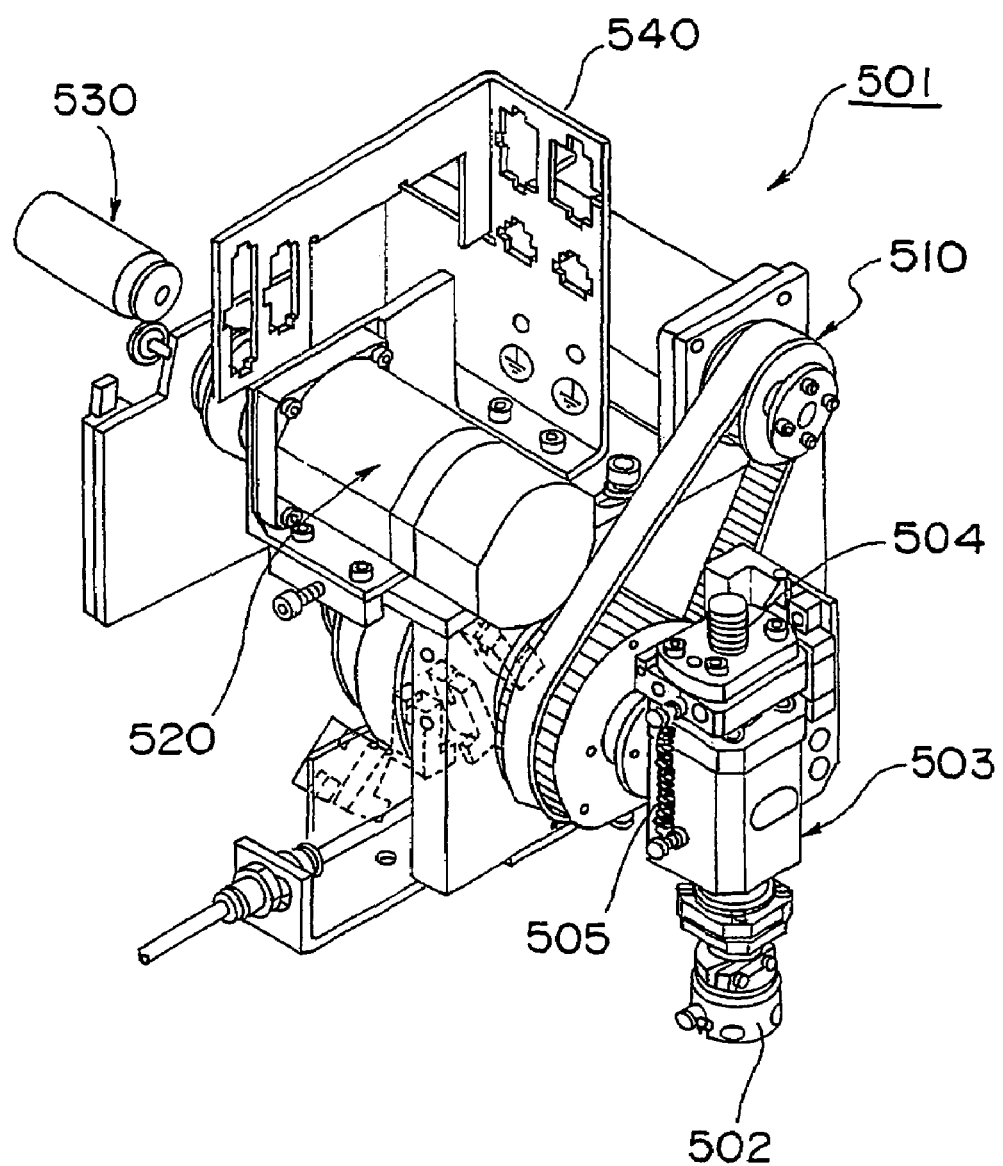
FIG. 12 is a perspective view showing a conventional component feeding head apparatus.

Description is hereinbelow given of component mounting operations in such structured electronic component mounting apparatus 101, in which the electronic component 2 fed from the component feeding apparatus 4 is moved by the inverting head apparatus 50 from the component pickup position to the component transfer position, where the electronic component 2 is transferred to the mounting head 20 in the mounting apparatus 5 so that the electronic component 2 is mounted on the substrate 3 by the mounting head 20. It is to be noted that a flowchart mainly showing the procedures of the inverting head apparatus 50 among these component mounting operations is shown in FIG. 7, schematic explanatory views showing the flow of the component mounting operations are shown in FIG. 8A to FIG. 8D, and with reference to FIG. 7 and FIG. 8A to FIG. 8D, the component mounting operations are described. It is to be noted that the respective operations described below are comprehensively controlled by the mounting control unit in the electronic component mounting apparatus 101, and the respective operations regarding the inverting head apparatus 50 among these operations in particular are subject to comprehensive control by the inverting head control unit 100.

Before specific operations are described, description is first given of the electronic component mounting apparatus 101 shown in FIG. 8A to FIG. 8D.

In the electronic component mounting apparatus 101 shown in FIG. 8A to FIG. 8D, the component feeding apparatus 4 is arranged on the left-hand side as viewed in the drawing while the mounting apparatus 5 is arranged on the right-hand side as viewed in the drawing. The position A in FIG. 8A to FIG. 8D is the component pickup position, and at the component pickup position A, a plurality of the electronic components 2 are arranged on the fed component arrangement unit 12 in a feedable manner by the inverting head 51. It is to be noted that on the fed component arrangement unit 12, the respective electronic components 2 are disposed with their mounting-side surfaces 2a to be mounted on the substrate 3 which is the side of the surface with a plurality of bumps or junction sections to the substrate 3 being formed thereon as their upper face sides.

Moreover, the position B in FIG. 8A to FIG. 8D is the component transfer position, and at the component transfer position B, the electronic components 2 are transferred from the inverting head 51 to the mounting head 20. Further, the position (or region) C in FIG. 8A to FIG. 8D is the substrate mounting region, and in the substrate mounting region C, the substrate holding table 28 holding the substrate 3 is located. It is to be noted that as shown in FIG. 8A, on the substrate 3, one electronic component 2 out of a plurality of electronic components 2 to be mounted on the substrate 3 is already mounted on the substrate 3 with its mounting-side surface facing down. It is to be noted that in FIG. 8A to FIG. 8D, the horizontal direction as viewed in the drawing is Y axis direction whereas the vertical direction as viewed in the drawing is Z axis direction.

In such an electronic component mounting apparatus 101, first, in step S1 shown in the flowchart of FIG. 7, in the inverting head apparatus 50, the inverting head 51 is moved by the head moving device 90 to the component transfer position A, while the electronic component 2 arranged on the fed component arrangement unit 12 and needed to be sucked and held is positioned to be aligned with the suction nozzle 52. It is to be noted that such positioning can be implemented by picking up images of the respective electronic components 2 arranged on the fed component arrangement unit 12 in the component feeding apparatus 4 by the recognition camera device 150, executing recognition processing of the images, and controlling the movement position of the inverting head 51 by the head moving device 90 based on the recognition result. Moreover, by providing the component feeding apparatus 4 with a moving device for moving the fed component arrangement unit 12 in X axis direction, the positioning can be performed two-dimensionally and reliably. It is to be noted that during the positioning, the inverting head 51 is in the state of being not inverted and the top end of the suction nozzle 52 is in the state of being positioned downward as viewed in the drawing.

Next, in the inverting head apparatus 50, the inverting head 51 is moved downward by the head lifting device 70 (step S2). More specifically, in FIG. 3 to FIG. 6, the lifting motor 71 is rotationally driven so that the lifting cam 72 in the state of being positioned at the position of an origin for up-and-down movement is rotated around the eccentric axis Q, the outer peripheral portion 72a is brought into contact with the lifting cam follower 73 while being pressed downward in Z axis direction as viewed in the drawing, and the nozzle support section 58 is moved downward while being guided by the LM guide 42 so as to lower the inverting head 51.

By this, the top end portion of the suction nozzle 52 is brought into contact with the mounting-side surface 2a of the electronic component 2 arranged on the fed component arrangement unit 12. Upon the contact, the electronic component 2 is sucked and held by the suction nozzle 52 from the mounting-side surface 2a (step S2). It is to be noted that this state is the state shown in FIG. 8A. Moreover, as shown in FIG. 8A, in the mounting apparatus 5, the mounting head 20 is in the state of being positioned at the substrate mounting position C. Moreover, if the respective electronic component 2 arranged on the fed component arrangement unit 12 are, for example, electronic components 2 fed from diced wafers, a pushup device or the like for pushing up the electronic component 2 to be picked up from their lower face is provided so that the electronic component 2 is brought into contact with the suction nozzle 52 in the state of being pushed up.

After that, in the state that the electronic component 2 is sucked and held, upward movement of the inverting head 51 is started by the head lifting device 70 (step S4), and the electronic component 2 is picked up from the fed component arrangement unit 12. More specifically, in FIG. 3 to FIG. 6, by driving the lifting motor 71 to rotate in direction opposite to the direction in the case of the downward movement operation, the lifting cam 72 in the state of being in contact with the lifting cam follower 73 is rotated in the opposite direction around the eccentric axis Q, so that the contact position between the outer peripheral portion 72a and the lifting cam follower 73 is positioned on the upper side, and the nozzle support section 58 constantly biased upward by the spring 41 is moved up while being guided by the LM guide 42 so as to move the nozzle support section 58 upward. It is to be noted that this state is the state shown in FIG. 8B. It is to be noted that as shown in FIG. 8B, in the mounting apparatus 5, the mounting head 20 is moved by the X-axis robot 22 to the left-hand side in X axis direction as viewed in the drawing and move to the upper side of the component transfer position B. Without being limited to this timing, such movement of the mounting head 20 may be performed by the time that the inverting head 51 is moved to the component transfer position B.

After the start of the upward movement of the inverting head 51 in the step S3 in FIG. 7, when the sucked and held electronic component 2 reaches a height position where interference with the other respective electronic components 2 arranged on the fed component arrangement unit 12 or other members is retreated, the movement of the inverting head 51 by the head moving device 90 toward the right-hand side in X axis direction as viewed in the drawing is started (step S5).

At the same time, as the need arises, θ-rotation of the suction nozzle 52 around the center of axis P by the θ-rotating unit 53 is performed (step S5). Such θ-rotation is executed to resolve the difference between the planar arrangement direction of the electronic component 2 on the fed component arrangement unit 12 and the planar arrangement direction of the electronic component 2 for mounting on the substrate 3. By performing such θ-rotation of the suction nozzle 52, the planar arrangement direction of the sucked and held electronic component 2 is rotated so that the electronic component 2 can be moved by the rotation to the planar arrangement direction for the mounting. It is to be noted that such a difference in arrangement direction is inputted in advance as, for example, arrangement direction data, into the inverting head control unit 100 or the like, by which the θ-rotating unit 53 is controlled by the inverting head control unit 100 to resolve the difference. If the difference in arrangement direction is not present, such θ-rotation is not performed. More specifically, in FIG. 3 to FIG. 6, the θ-rotation motor 54 is rotationally driven, and the rotational driving is transmitted to the suction nozzle 52 via the respective pulleys 57, 59 and the belt 56, so that the suction nozzle 52 is rotated around the center of axis P for resolving the difference.

Further, along with the start of the movement of the inverting head 51 by the head moving device 90, the correcting operation of the arrangement position of the inverting head 51 in Y axis direction is performed by the Y-axis direction correction device 80 (step S5). Thus, by performing the correcting operation in the Y axis direction, displacement between the component pickup position A and the component transfer position B in Y axis direction can be corrected and the inverting head 51 can be reliably positioned at the component transfer position B. More specifically, in FIG. 3 and FIG. 4, the correction motor 83 is rotationally driven so as to rotate the correction cam 84 around the eccentric axis S, and the correction cam follower 85 which is in the state of being biased by the spring 86 and constantly in contact with the outer peripheral portion of the correction cam 84 is moved in Y axis direction as viewed in the drawing, so that the Y-axis direction movable frame 81a is moved in Y axis direction as viewed in the drawing while being guided by the LM guide 82, by which the correction movement of the inverting head 51 is performed.

After that, once the inverting head 51 moving upward reaches the upper limit position for the upward movement, the upward movement by the head lifting device 70 is stopped and completed (step S6). Such an upper limit position for the upward movement is detected based on a rotational driving amount of the lifting motor 71, or by detecting, with use of the dog 74 and the sensor 75 shown in FIG. 5, that the contact retreat part on the outer peripheral portion 72a of the lifting cam 72 is positioned at the lower end position in Z axis direction (i.e., at the position of a cam origin). Moreover, at the upper limit position, the lifting cam 72 is in the state of being positioned at the position of an origin for up-and-down movement, and a space is secured between the lifting cam 72 and the lifting cam follower 73 so as to retreat contact therebetween. More particularly, the head lifting device 70 and the inverting head 51 are in the state of being separated from each other.

After that, the inverting head 51 after being moved in X axis direction as viewed in the drawing and separated from the head lifting device 70 is inverted by the head inverting device 60 (step S7). More specifically, in FIG. 3 to FIG. 6, the inverting motor 61 is rotationally driven, and the rotational driving is transmitted to the inversion shaft 66 via the respective pulleys 62, 64 and the belt 63, so that the inversion shaft 66 is rotated around the inversion axis R and the nozzle support section 58 is rotated via the LM guide 42, by which the inverting head 51 is inverted around the inversion axis R. Thus, by inverting the inverting head 51, the suction nozzle 52 can be inverted in Z axis direction as viewed in the drawing, by which the mounting-side surface 2a of the electronic component 2 sucked and held by the top end portion of the suction nozzle 52 positioned on the upper side may face down. It is to be noted that when such inversion is performed, the head lifting device 70 and the inverting head 51 are in the state of being separated from each other, which prevents interference between the inverting head 51 and the head lifting device 70.

After that, the inverting operation of the inverting head 51 by the head inverting device 60 and the correcting operation in Y axis direction by the Y-axis direction correction device 80 are completed, and the inverting head 51 is positioned at the component transfer position B, by which the movement of the inverting head 51 in X axis direction by the head moving device 90 is stopped and completed (step S8).

At the same time, the mounting head 20 positioned at the component transfer position B is moved downward, and the top face of the electronic component 2 sucked and held by the top end portion of the suction nozzle 52 of the inverting head 51 is sucked and held by the mounting head 20. Along with this, suction and holding of the electronic component 2 by the suction nozzle 52 of the inverting head 51 is released, and by moving the mounting head 20 upward, transfer of the electronic component 2 to the mounting head 20 is performed (step S9). This state is the state shown in FIG. 8C.

After that, as shown in FIG. 8D, in the mounting apparatus 5, the mounting head 20 which received the electronic component 2 is moved to the substrate mounting position C, where mounting of the electronic component 2 on the substrate 3 is performed. It is to be noted that the mounting operation of the electronic component 2 on the substrate 3 has been described before and therefore the description is omitted herein.

Description is now given of the moving operation of the mounting head 20 in the electronic component mounting apparatus 101 from the position in the vicinity of the substrate holding table 28 in the substrate mounting region C to the component transfer position B where transfer of the electronic component 2 with the inverting head 51 is performed.

Before the movement of the mounting head 20 in the first embodiment is described, the conventional movement will be described first. It is to be noted that the mounting head 20 and other component parts are expressed by the same reference numerals in the electronic component mounting apparatus 101 for convenience.

First, a schematic explanatory view showing the conventional moving operation of the mounting head 20 is shown in FIG. 9. As shown in FIG. 9, at the substrate mounting region C, a mounting head 20 (mounting head 20 shown by a broken line in the drawing) moved downward to the top face of a substrate holding table 28 is first moved upward to a sensor height position H2, a predetermined height position. Once it is detected by an unshown sensor at the sensor height H2 that the mounting head unit is moved upward to the sensor height position H2, movement of the mounting head 20 toward the left-hand direction in X axis direction as viewed in the drawing is started. Then, upward movement of the mounting head 20 and movement in X axis direction are performed simultaneously, and along a movement track D, the mounting head 20 is moved to a target height position H1 above an inverting head 51 at the component transfer position B. In such conventional movement, the movement in X axis direction is started simply after the detection by the sensor, and so the movement can be performed with simple processing.

However, a sensor dedicated for the detection needs to be located, and if the sensor breaks down, interference between the mounting head 20 and the inverting head 51 may occur. Further, the sensor detects only the sensor height position H2, that is a height position, and so if the moving speed of the mounting head 20 in X axis direction is changed, the mounting head 20 moves, for example, laying a movement track E as shown in FIG. 10, thereby posing a risk of interference between the mounting head 20 and the inverting head 51.

The moving operation of the mounting head 20 in the first embodiment for solving such a problem is shown in FIG. 11. As shown in FIG. 11, first, when the movement of the mounting head 20 is started, coordinate data about a pass point T of the movement track F which prevents interference between the mounting head 20 and the inverting head 51 is determined in the mounting control unit or the like. It is to be noted that the coordinate data may be preset in the mounting control unit or the like.

Next, in the mounting control unit or the like, times necessary for passing the pass point T by the movement of the mounting head 20 are calculated in the case of the movement in Z axis direction and in the case of the movement in X axis direction, respectively. After that, the moving operation which takes a longer time among the calculated times is started first, while a difference between the respective times is calculated, and after the start is held up for the difference, the other movement is started. By performing the respective moving operations in this way, it becomes possible to simultaneously pass the pass point T by the respective moving operations, i.e., the mounting head 20 may move laying a movement track F which certainly passes the pass point T.

By performing such moving operations, it becomes possible to prevent the mounting head 20 from interference with the inverting head 51 even if the moving speed is changed in Z axis direction or in X axis direction, thereby allowing reliable and effective movement of the mounting head 20. It is to be noted that if the inverting head 51 is not positioned at the component transfer position B, then the mounting head 20 may be moved more linearly by the most direct way without movement control to lead the mounting head 20 to pass the pass point T.

EFFECT BY FIRST EMBODIMENT

According to the first embodiment, the following various effects can be obtained.

First, in the inverting head apparatus 50, the inverting head 51 which is an object subjected to the inverting operation and the up-and-down operation has a minimum structure composed of only the suction nozzle 52 and the θ-rotating unit 53 performing θ-rotation of the suction nozzle 52, and the head inverting device 60 performing the inverting operation of the inverting head 51 and the head lifting device 70 performing the up-and-down operation are not included in the object but are provided independently of the inverting head 51, which allows the inverting head 51 to be downsized.

Further, the inverting head 51 is supported by the inversion shaft 66 performing rotation around the inversion axis R in the head lifting device 70 mounted on the head frame 81 in a manner allowing up-and-down movement in Z axis direction via the LM guide 42, and between the lifting cam 72 performing eccentric rotation around the eccentric axis Q in the head inverting device 60 also mounted on the head frame 81 and the lifting cam follower 73 mounted on the inverting head 51 coming into contact with the outer peripheral portion 72a of the lifting cam 72, a space large enough to avoid contact therebetween can be secured due to the rotational position of the lifting cam 72, which downsizing of such an inverting head 51 can be achieved.

More particularly, since the inverting head 51 is supported by the head inverting device 60 movably in Z axis direction via the LM guide 42, the up-and-down operation of the inverting head 51 in Z axis direction can be performed by the head lifting device 70 while the inverting head 51 is guided by the LM guide 42 without being influenced by the head inverting device 60. Further, since the space can be secured between the lifting cam 72 and the lifting cam follower 73 by the rotational position of the lifting cam 72, the inverting operation of the inverting head 51 can be performed by the head inverting device 60 in the state that the head lifting device 70 and the inverting head 51 are separated from each other without being influenced by the head lifting device 70. Consequently, it becomes possible to provide the head inverting device 60 and the head lifting device 70 which respectively perform the inverting operation and the up-and-down operation of the inverting head 51 as different constitutions from the inverting head 51. Therefore, the inverting head 51 itself may be structured to have a requisite minimum mechanism as described above, and so downsizing of the inverting head 51 can be achieved.

Thus, downsizing of the inverting head 51 can be achieved in the inverting head apparatus 50, by which the inverting head 51 to be moved can be positioned between the mounting head 20 and the substrate holding table 28 in the mounting apparatus 5, or if not positioned therebetween in actuality, the inverting head 51 can be moved as close as possible to the vicinity of the substrate mounting position C.

Therefore, the effects which are impossible to realize in the conventional component feeding head apparatus 501 can be achieved, and as a consequence, among a component feeding line that is a movement line of the inverting head 51 (i.e., a movement line from the component pickup position A to the component transfer position B) and a component mounting line that is a movement line of the mounting head 20 (i.e., a movement line from the component transfer position B to the substrate mounting region C), the distance of the component mounting line of the mounting head 20 which exerts a direct influence on the component mounting operation can be set shorter and the operation speed thereof is kept low so as to decrease the generation of vibration, while at the same time, the distance of the component feeding line of the inverting head 51 which exerts less direct influence on the component mounting operation can be set longer and the operation speed thereof can be increased. Therefore, it becomes possible to provide the inverting head apparatus 50, the component feeding apparatus 4 having the inverting head apparatus 50, and the electronic component mounting apparatus 101 which can achieve and implement both the enhanced prevision and the increased productivity in the component mounting.

It is to be noted that in the working example of the practical electronic component mounting apparatus 101, the distance size between the component pickup position A and the component transfer position B in FIG. 8A to FIG. 8D could be set longer, and the distance size between the component transfer position B and the substrate mounting region C could be shortened from the conventional size of about 450 mm to about 130 mm. Moreover, since the downsizing of the inverting head 51 itself makes it possible to decrease the size in Z axis direction, the distance size between the mounting head 20 and the substrate holding table 28 for example could be shortened from the conventional size of about 200 mm to about 67 mm, and further the downsized inverting head 51 could be positioned therebetween.

Moreover, in the inverting head apparatus 50, the head frame 81 supporting the inverting head 51 in a manner allowing up-and-down movement and inversion as well as supporting the head inverting device 60 and the head lifting device 70 has the Y-axis direction movable frame 81a and the X-axis direction movable frame 81b, the Y-axis direction movable frame 81a performing the support operation while being able to move in Y axis direction on the top face of the X-axis direction movable frame 81b by the Y-axis direction correction device 80, by which the inverting head 51 can be moved also in Y axis direction.

Therefore, in the inverting head apparatus 50, downsizing of the inverting head 51 can be realized, and at the same time, wide operations of the inverting head 51 including the E-rotation of the suction nozzle 52 by the inverting head 51, the up-and-down movement and inversion of the inverting head 51, and the movement of the inverting head 51 in X axis direction and Y axis direction can be realized, which makes it possible to support the component mounting with higher precision and to increase the productivity in the component mounting.

SECOND EMBODIMENT

It is to be noted that the present invention is not limited to the embodiment described so far, and can be embodied in other various aspects. For example, a component feeding apparatus according to a second embodiment of the present invention will be described below.

Although the component feeding apparatus of the second embodiment has a structure different from that of the first embodiment in the point that the recognition camera device 150 arranged on the fed component arrangement unit 12 of the component feeding apparatus 4 in the first embodiment is replaced with an recognition camera device exemplifying the component recognition device having a different structure, other constructions of the component feeding apparatus of the second embodiment are identical to those of the first embodiment. Consequently, in the following description, description is only given of the different structure. It is to be understood that in the following description, component parts having the same structure as that of the first embodiment are designated by the same reference numerals and their description is omitted for easier understanding.

Figure 14:
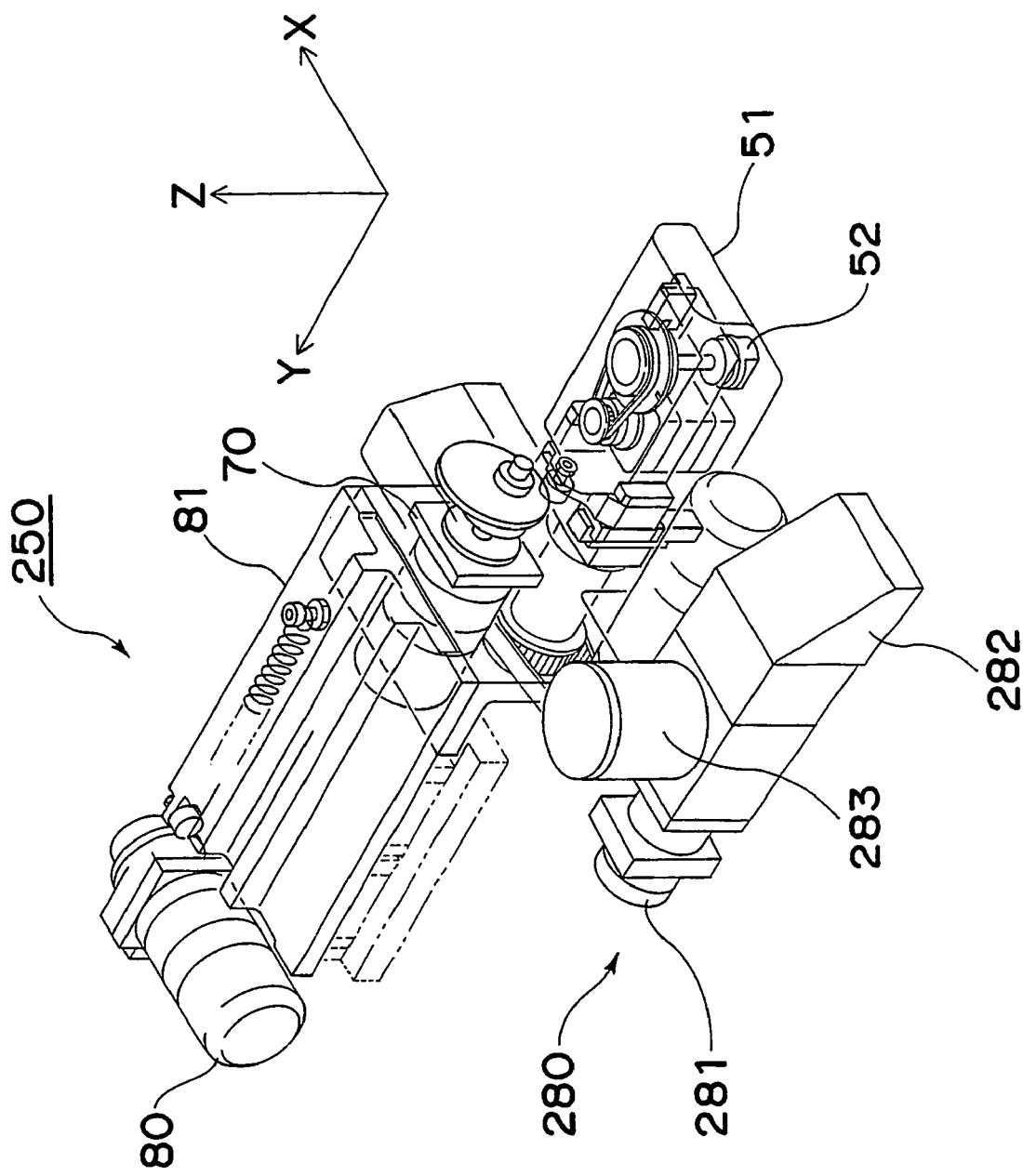
FIG. 14 is a fragmentary perspective view showing an inverting head unit having a recognition camera device according to a second embodiment of the present invention.
Figure 15:
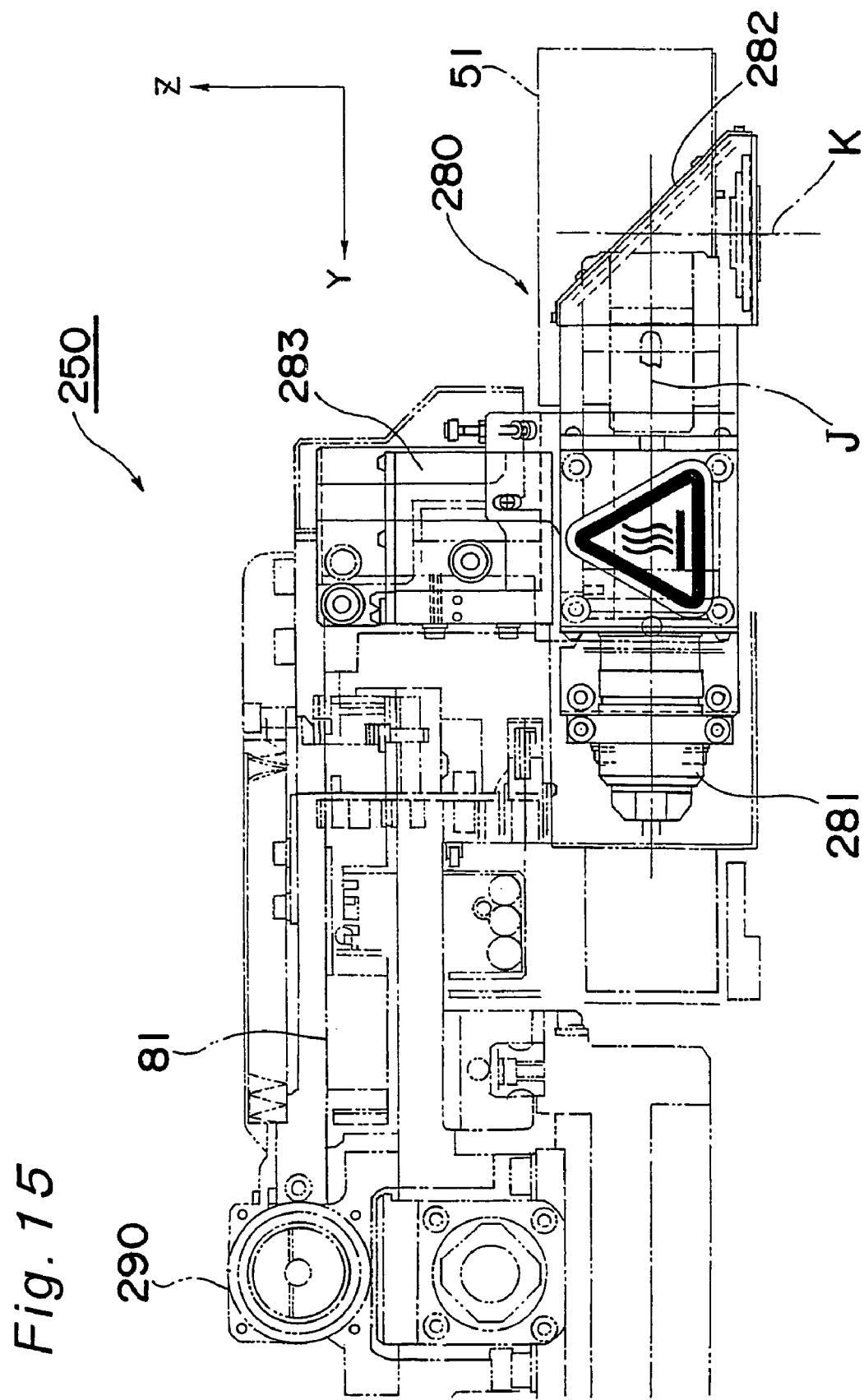
FIG. 15 is a side view showing the recognition camera device of FIG. 14 as viewed from X axis direction.
Figure 16:
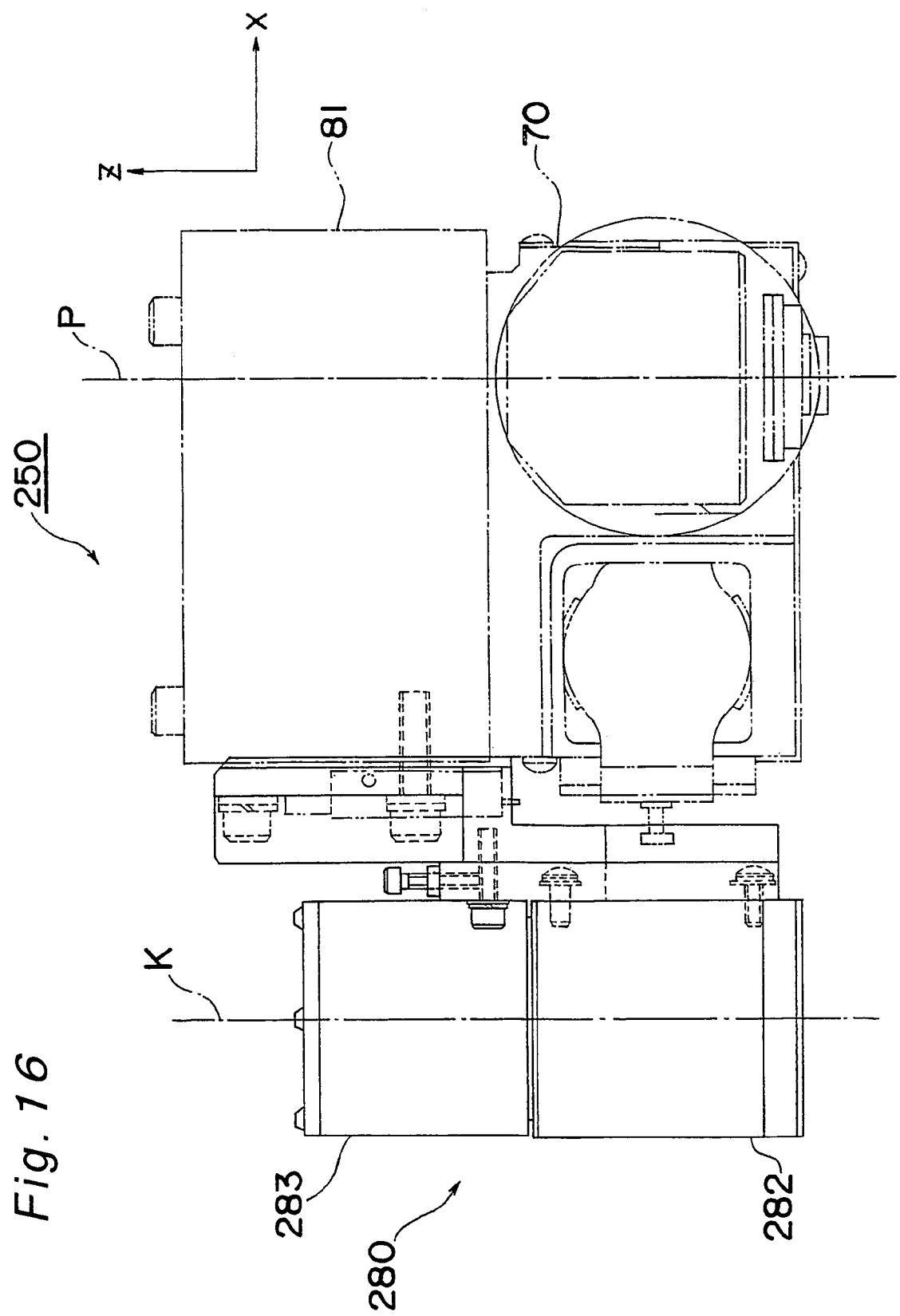
FIG. 16 is a front view the recognition camera device of FIG. 14 as viewed from Y axis direction.
Figure 17:
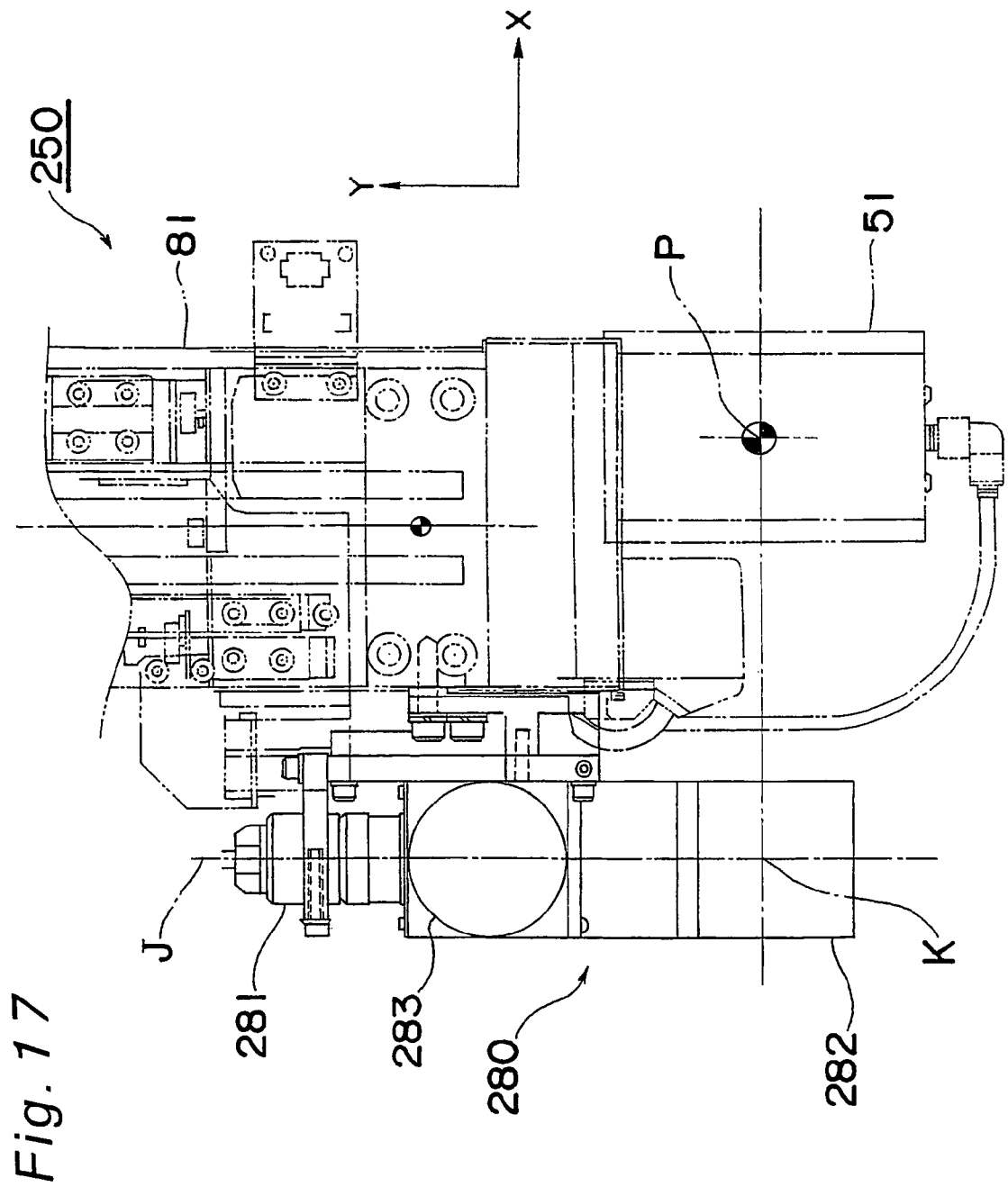
FIG. 17 is a front view the recognition camera device of FIG. 14 as viewed from Z axis direction.

First, a fragmentary enlarged perspective view showing an inverting head apparatus 250 included in a component feeding apparatus (component feeding unit) in the second embodiment is shown in FIG. 14. As shown in FIG. 14, the inverting head apparatus 250 has almost the same construction as that of the inverting head apparatus 50 of the first embodiment shown in FIG. 3, but has a different construction in the point that a recognition camera device 280 is provided adjacent to the inverting head 51. A fragmentary side view of such a recognition camera device 280 as viewed from X axis direction in the drawing is shown in FIG. 15, a fragmentary front view as viewed from Y axis direction is shown in FIG. 16, and a fragmentary plane view as viewed from Z axis direction is shown in FIG. 17.

As shown in FIG. 14 to FIG. 17, in the inverting head apparatus 250, the recognition camera device 280 is fixed onto a head frame 81 so as to be disposed on the left-hand side of an inverting head 51 in X axis direction as viewed in the drawing in the state of being integrated with the head frame 81. Consequently, by moving the head frame 81 by a head moving device 290 (unshown in FIG. 14 through FIG. 17) along X axis direction as viewed in the drawing, the recognition camera device 280 can be moved together with the inverting head 51 in X axis direction as viewed in the drawing.

Moreover, as shown in FIG. 14, the recognition camera device 280 has a camera section 281 arranged on the left-hand side in Y axis direction as viewed in the drawing and having an optical axis J (shown in FIG. 15) arranged along Y axis direction, a reflection mirror section 282 having an image pickup axis K (shown in FIG. 15) arranged along Z axis direction as viewed in the drawing and reflecting an image of the electronic component 2, which upwardly comes incident along the image pickup axis K, along the optical axis J, and a lighting section 283 for providing necessary lighting for picking up the image of the electronic component 2. Moreover, the image pickup axis K and a center of axis P of a suction nozzle 52 included in the inverting head 51 are arranged so that their arrangement positions in Y axis direction are aligned (i.e., arranged in alignment along X axis direction).

Figure 18:
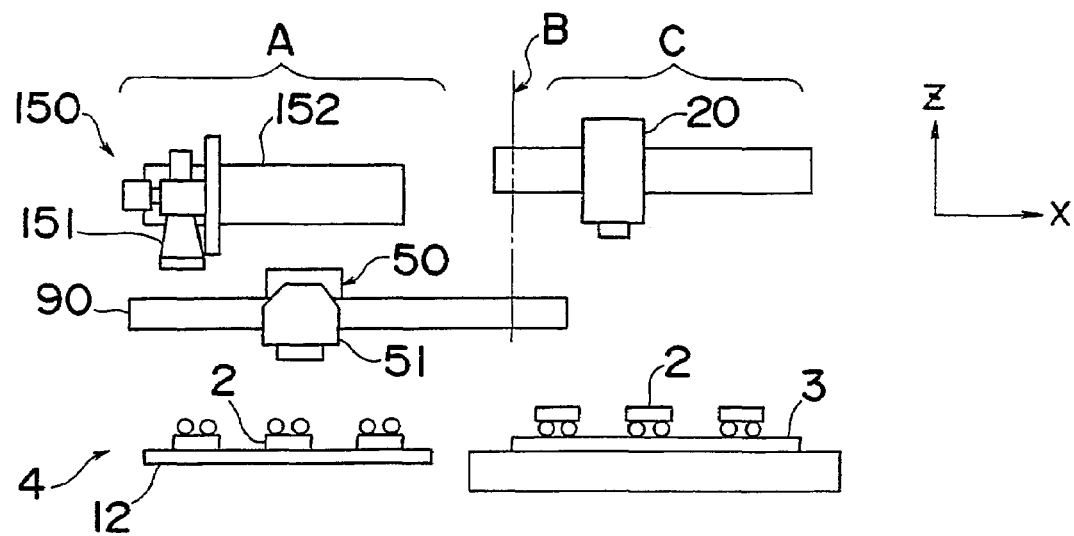
FIG. 18 is a schematic explanatory view showing the operation of the inverting head unit in the second embodiment.

Description is given of the operations from the operation to suck and pick up the electronic component 2 in the inverting head apparatus 250 having such-structured recognition camera device 280 to the operation to transfer the sucked and picked-up electronic component 2 to the mounting head 20 with reference to a schematic explanatory view shown in FIG. 18.

As shown in FIG. 18, in the inverting head apparatus 250, by moving the head frame 81 by the head moving device 290 along X axis direction as viewed in the drawing, the recognition camera device 280 is moved integrally with the head frame 81 to a component pickup position A, while the electronic component 2 arranged on a fed component arrangement unit 12 and needed to be sucked and held is positioned to be aligned with the image pickup axis K of the recognition camera device 280.

After the positioning, an image of the electronic component 2 is picked up by the recognition camera device 280. The picked-up image is inputted into an inverting head control unit 100 and is subjected to image recognition processing, and based on the recognition result, the arrangement position of the electronic component 2 is recognized.

After that, based on the recognition result of the arrangement position, the head frame 81 is moved by a head moving device 290 along X axis direction as viewed in the drawing so that the inverting head 51 is moved integrally with the head frame 81, while the electronic component 2 is positioned to be aligned with the center of axis P of the suction nozzle 52 in the inverting head 51. It is to be noted that during the positioning, the inverting head 51 is in the state of being not inverted and the top end of the suction nozzle 52 is in the state of being positioned downward as viewed in the drawing.

Next, in the inverting head apparatus 250, the inverting head 51 is moved downward by the head lifting device 70 and in the same procedures as those in the first embodiment, the electronic component 2 are sucked and picked up by the inverting head 51.

After that, by moving the head frame 81 by the head moving device 290 in X axis direction as viewed in the drawing, the inverting head 51 for sucking and holding the electronic component 2 is moved to the component transfer position B. In the process of this movement, the inverting operation of the inverting head 51 is performed. Moreover, along with the movement of the inverting head 51, the recognition camera device 280 fixed to the head frame 81 is integrally moved.

Upon reaching the component transfer position B, the inverting head 51 transfers the sucked and held electronic component 2 to the mounting head 20 which is also moved from the substrate mounting position C to the component transfer position B. After that, the mounting head 20 is moved to the substrate mounting position C, where the mounting operation of the electronic component 2 on the substrate 3 is performed.

In the meantime, the inverting head 51 and the recognition camera device 280 are integrally moved from the component transfer position B to the component pickup position A, and the image pickup operation of the next electronic component 2 is performed by the recognition camera device 280.

From this point onward, the same operations are repeated, by which the suction/pickup operation and the mounting operation of a plurality of electronic components 2 are performed.

EFFECT BY SECOND EMBODIMENT

According to the second embodiment, by utilizing the increased moving speed of the inverting head 51 by the head moving device 290, not only the inverting head 51 but also the recognition camera device 280 for picking up images of electronic components 2 are supported by the head frame 81, so that the movement of the inverting head 51 and the recognition camera device 280 in X axis direction can be driven by the head moving device 290.

Figure 19:
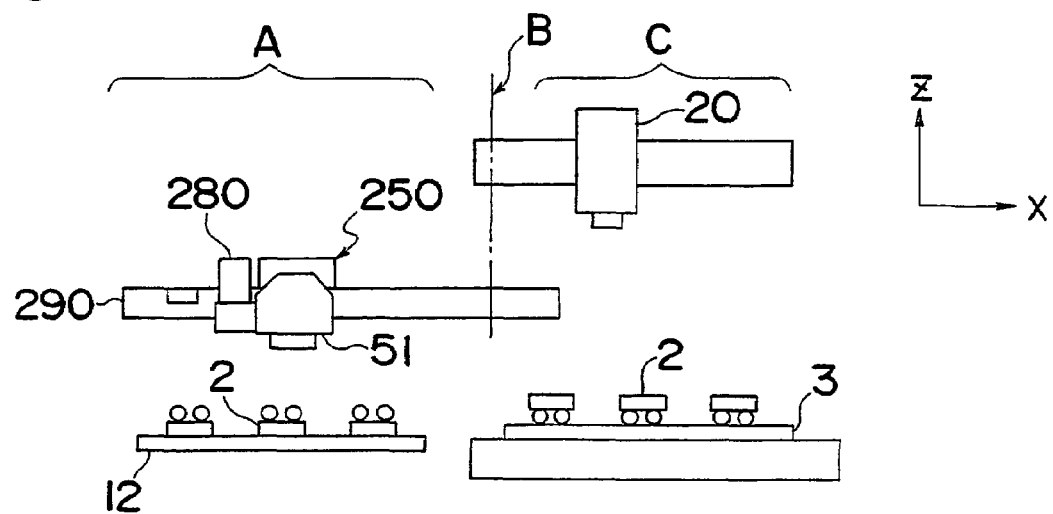
FIG. 19 is a schematic explanatory view showing the operation of the inverting head unit and the recognition camera device in the first embodiment.

Such a structure makes it possible to make the construction of the recognition camera device 280 simpler and the cost of the entire device smaller than those in the case where, like the structure of the electronic component mounting apparatus 101 of the first embodiment shown in the schematic explanatory view of FIG. 19, the component feeding apparatus 4 has the head moving device 90 for driving the movement of the inverting head 51 and the camera moving device 152 for driving the movement of the camera 151 in the recognition camera device 150 independently.

Moreover, if the head moving device 290 takes charge of the movement of both the recognition camera device 280 and the inverting head section in X axis direction as stated above, the moving speed of the inverting head 51 and the recognition camera device 280 by the head moving device 290 is increased (e.g., moving speed: 1 m/0.5 sec.), so that the image pickup operation of the next electronic component 2 which is sucked and held in the next place, the sucking and holding operation of the electronic component 2, and the moving operation of the inverting head 51 from the component pickup position A to the component transfer position B can be performed during the mounting operation of the electronic component 2 by the mounting head 20, and therefore the time necessary for the component mounting operation is not increased.

Therefore, in the electronic components mounting device, effective feeding operation and mounting operation of electronic components can be performed, while at the same time, the structure thereof can be simplified and cost reduction can be achieved.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A component feeding head apparatus for holding at a component pickup position, a component, from a mounting-side surface of the component, arrayed in a component arrangement unit and to be mounted on a substrate, then transferring the held component to a component transfer position while inverting the mounting-side surface of the component, and then transferring the component to a mounting head unit at the component transfer position so as to mount the component on the substrate by the mounting head unit, said component feeding head apparatus comprising:

a head unit having a holding unit for releasably holding the component with the mounting-side surface of the component and a central axis of said holding unit being orthogonal;

a head inverting device having a lifting-support-guiding section which supports said head unit in a manner allowing up-and-down movement along the central axis of said holding unit, for guiding the up-and-down movement, said head inverting device for inverting said head unit about an inversion axis arranged in a direction almost orthogonal to the central axis of said holding unit via said lifting-support-guiding section so as to invert said holding unit relative to a direction of the central axis;

a head lifting device for moving said head unit up and down in a direction along the central axis of said holding unit while being guided by said lifting-support-guiding section so as to move said holding unit up and down;

a head support unit for supporting said head lifting device and said head inverting device; and a head moving device for moving said head support unit between the component pickup position and the component transfer position along a movement direction which is a direction along a surface of the substrate, wherein said head unit is independent of said head inverting device and said head lifting device such that inversion of said head unit by said head inverting device is performed without inversion of said head lifting device, and such that up-and-down movement of said head unit by said head lifting device is performed without up-and-down movement of said head inverting device.

2. The component feeding head apparatus as defined in claim 1, wherein said head lifting device comprises:

a cam, having an axis of rotation arranged in a direction almost orthogonal to the central axis of said holding unit as an eccentric axis, for performing an eccentric rotational motion around the eccentric axis;

a lifting driving unit for driving said cam to perform the eccentric rotational motion around the eccentric axis; and a cam follower provided on said head unit for converting the eccentric rotational motion of said cam to an up-and-down reciprocating motion in a direction along the central axis of said holding unit.

3. The component feeding head apparatus as defined in claim 2, wherein said cam has a cam curve portion formed continuously around the eccentric axis for transmitting the eccentric rotational motion to said cam follower, and said cam curve portion includes a contact part for coming into contact with said cam follower, and a contact retreat part formed in succession with said contact part for eliminating the contact with between said cam and said the cam follower.

4. The component feeding head apparatus as defined in claim 3, wherein said head inverting device is for inverting said head unit in a state that contact between said cam and said cam follower is not present.

5. The component feeding head apparatus as defined in claim 4, wherein said head lifting device further comprises a rotational load unit for imparting a rotational load to the eccentric rotational motion of said cam in a state that contact between said cam and said earn follower is not present.

6. The component feeding head apparatus as defined in claim 2, wherein the eccentric axis of said cam and the inversion axis of said head inverting device are each arranged in a direction which is placed along the surface of the substrate and almost orthogonal to the movement direction of said head moving device.

7. The component feeding head apparatus as defined in claim 1, further comprising a head support unit moving device for moving said head support unit in a direction almost orthogonal to the central axis of said holding unit and almost orthogonal to the movement direction of said head moving device.

8. The component feeding head apparatus as defined in claim 1, wherein said lifting-support-guiding section includes an LM guide having a rail section mounted on one of said head unit and said head inverting device, and a rail engagement section which is mounted on the other of said head unit and said head inverting device and is movable while being engaged with and guided by said rail section.

9. The component feeding head apparatus as defined in claim 1, further comprising a component recognition device for picking up images of components arrayed in the component arrangement unit and recognizing arrangement of the components in the component arrangement unit, wherein said component recognition device is supported by said head support unit and said head moving device allows said component recognition device to be moved together with said head support unit.

10. The component feeding head apparatus as defined in claim 1, wherein said head unit further comprises a rotating unit for rotating said holding unit around the central axis thereof.

11. A component feeding apparatus, comprising:

the component feeding head apparatus as defined in claim 1;

the component arrangement unit for arranging a plurality of components so as to be picked up by said head unit; and a component feeding/containing unit for containing respective ones of the plurality of components in a manner allowing these components to be fed in said component arrangement unit.

12. A component mounting apparatus, comprising:

the component feeding apparatus as defined in claim 11;

the mounting head unit for releasably holding the component;

a substrate holding unit for releasably holding the substrate; and a positioning device for positioning said substrate holding unit and said mounting head unit.

* * * * *

UNITED STATES PATENT AND TRADEMARK OFFICE
CERTIFICATE OF CORRECTION

PATENT NO. : 7,350,289 B2  Page 1 of 1
APPLICATION NO. : 10/536361
DATED : April 1, 2008
INVENTOR(S) : Shoriki Narita et al.

It is certified that error appears in the above-identified patent and that said Letters Patent is hereby corrected as shown below:

ON THE FRONT PAGE

In column 2, line 22, please change "JP     2004-047927    12/2004" to --JP    2004-047927    2/2004--.

Signed and Sealed this

Thirtieth Day of September, 2008

JON W. DUDAS
*Director of the United States Patent and Trademark Office*